US012592668B1

(12) United States Patent
Perreault et al.

(10) Patent No.: US 12,592,668 B1
(45) Date of Patent: Mar. 31, 2026

(54) SUPPLY GENERATOR AND ASSOCIATED CONTROL METHODS

(71) Applicant: Murata Manufacturing Co., Ltd., Kyoto (JP)

(72) Inventors: David J. Perreault, Cambridge, MA (US); James Garrett, Windham, NH (US); Sri Harsh Pakala, Chandler, AZ (US); Brendan Metzner, North Billerica, MA (US); Ivan Duzevik, Portland, ME (US); John R. Hoversten, Arlington, MA (US); Yevgeniy A. Tkachenko, Belmont, MA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 106 days.

(21) Appl. No.: 18/440,349

(22) Filed: Feb. 13, 2024

Related U.S. Application Data

(63) Continuation of application No. 18/180,886, filed on Mar. 9, 2023, now Pat. No. 11,949,383, which is a continuation of application No. 17/012,821, filed on Sep. 4, 2020, now Pat. No. 11,637,531.

(60) Provisional application No. 62/896,143, filed on Sep. 5, 2019.

(51) Int. Cl.
H03F 1/02 (2006.01)
H03F 3/21 (2006.01)

(52) U.S. Cl.
CPC ........... H03F 1/0227 (2013.01); H03F 1/025 (2013.01); H03F 3/21 (2013.01); H03F 2200/105 (2013.01); H03F 2200/451 (2013.01)

(58) Field of Classification Search
CPC .......... H03F 1/0227; H03F 1/025; H03F 3/21; H03F 2200/105; H03F 2200/45
USPC ...................................................... 330/51, 297
See application file for complete search history.

(56) References Cited

U.S. PATENT DOCUMENTS

| | | | |
|---|---|---|---|
| 5,734,258 A | 3/1998 | Esser | |
| 6,275,016 B1 | 8/2001 | Ivanov | |
| 7,103,114 B1 | 9/2006 | Lapierre | |
| 7,129,680 B2 * | 10/2006 | Higashitani | H02M 3/1582 |
| | | | 323/224 |
| 7,482,869 B2 | 1/2009 | Wilson | |
| 7,724,839 B2 | 5/2010 | Chen et al. | |
| 7,746,041 B2 | 6/2010 | Xu et al. | |
| 7,777,459 B2 | 8/2010 | Williams | |
| 7,782,027 B2 | 8/2010 | Williams | |

(Continued)

FOREIGN PATENT DOCUMENTS

WO     WO 2010/081843     7/2010

OTHER PUBLICATIONS

U.S. Appl. No. 18/180,886, filed Mar. 9, 2023, Perreault, et. al.

(Continued)

*Primary Examiner* — Andrea Lindgren Baltzell
*Assistant Examiner* — Khiem D Nguyen
(74) *Attorney, Agent, or Firm* — Daly, Crowley, Mofford & Durkee, LLP

(57) ABSTRACT

Described are concepts, circuits, systems and techniques directed toward N-phase control techniques useful in the design and control of supply generators configured for use in a wide variety of power management applications including, but not limited to mobile applications.

51 Claims, 14 Drawing Sheets

(56)                 References Cited

U.S. PATENT DOCUMENTS

| | | |
|---|---|---|
| 7,786,712 B2 | 8/2010 | Williams |
| 7,812,579 B2 | 10/2010 | Williams |
| 7,977,927 B2 | 7/2011 | Williams |
| 8,026,763 B2 | 9/2011 | Dawson et al. |
| 8,164,384 B2 | 4/2012 | Dawson et al. |
| 8,212,541 B2 | 7/2012 | Perreault et al. |
| 8,824,978 B2 | 9/2014 | Briffa et al. |
| 8,829,993 B2 | 9/2014 | Briffa et al. |
| 8,830,709 B2 | 9/2014 | Perreault et al. |
| 8,830,710 B2 | 9/2014 | Perreault et al. |
| 8,860,396 B2 | 10/2014 | Giuliano |
| 8,957,727 B2 | 2/2015 | Dawson et al. |
| 9,020,453 B2 | 4/2015 | Briffa et al. |
| 9,088,211 B2 | 7/2015 | Ivanov et al. |
| 9,160,287 B2 | 10/2015 | Briffa et al. |
| 9,166,536 B2 | 10/2015 | Briffa et al. |
| 9,172,336 B2 | 10/2015 | Briffa et al. |
| 9,209,758 B2 | 12/2015 | Briffa et al. |
| 9,385,553 B2 | 7/2016 | Aiura |
| 9,490,752 B2 | 11/2016 | Briffa et al. |
| 9,531,291 B2 | 12/2016 | Perreault |
| 9,537,456 B2 | 1/2017 | Briffa et al. |
| 9,634,577 B2 | 4/2017 | Perreault |
| 9,755,672 B2 | 9/2017 | Perreault et al. |
| 9,768,731 B2 | 9/2017 | Perreault et al. |
| 9,768,732 B2 | 9/2017 | Briffa et al. |
| 9,917,517 B1 | 3/2018 | Jiang et al. |
| 9,979,421 B2 | 5/2018 | Astrom et al. |
| 10,056,864 B2 | 8/2018 | Hur et al. |
| 10,164,577 B2 | 12/2018 | Briffa et al. |
| 10,193,441 B2 | 1/2019 | Giuliano |
| 10,389,235 B2 | 8/2019 | Giuliano |
| 10,658,981 B2 | 5/2020 | Briffa et al. |
| 10,840,805 B2 | 11/2020 | Perreault et al. |
| 10,992,265 B2 | 4/2021 | Hoversten et al. |
| 11,043,918 B2 | 6/2021 | Tanaka et al. |
| 11,191,028 B2 | 11/2021 | Hoversten et al. |
| 11,245,367 B2 | 2/2022 | Garrett et al. |
| 11,558,014 B2 | 1/2023 | Tanaka et al. |
| 11,637,531 B1 | 4/2023 | Perreault et al. |
| 11,664,727 B2 | 5/2023 | Giuliano et al. |
| 11,736,010 B2 | 8/2023 | Giuliano et al. |
| 11,757,410 B2 | 9/2023 | Hoversten et al. |
| 11,757,411 B2 | 9/2023 | Tanaka et al. |
| 2010/0073084 A1 | 3/2010 | Hur et al. |
| 2021/0385752 A1 | 12/2021 | Hoversten et al. |
| 2022/0103066 A1 | 3/2022 | Chen et al. |
| 2022/0149725 A1 | 5/2022 | Garrett et al. |
| 2023/0054485 A1 | 2/2023 | Hoversten et al. |
| 2023/0056740 A1 | 2/2023 | Perreault et al. |
| 2023/0057037 A1 | 2/2023 | Hoversten et al. |
| 2023/0361730 A1 | 11/2023 | Garrett et al. |
| 2023/0378921 A1 | 11/2023 | Garrett et al. |

OTHER PUBLICATIONS

U.S. Appl. No. 18/353,331, filed Jul. 17, 2023, Garrett, et al.
Raab; "Average Efficiency of Class-G Power Amplifiers"; IEEE Transactions on Consumer Electronics; vol. CE-32; No. 2; pp. 145-150; May 1986; 6 Pages.

Choi, et al.; "A $\Delta\Sigma$-Digitized Polar RF Transmitter"; IEEE Transactions on Microwave theory and Techniques; vol. 55; No. 12; pp. 2679-2690; Dec. 2007; 12 Pages.
Godoy, et al.; "A 2.4-GHz, 27-dBm Asymmetric Multilevel Outphasing Power Amplifier in 65-nm CMOS"; IEEE Journal of Solid-State Circuits; vol. 47; No. 10; pp. 2372-2384; Oct. 2012; 13 Pages.
Lee, et al.; "Power-Tracking Embedded Buck-Boost Converter With Fast Dynamic Voltage Scaling for the SoC System"; IEEE Transactions on Power Electronics; vol. 27; No. 3; pp. 1271-1282; Mar. 2012; 12 Pages.
Vasić, et al.; "Comparison of Two Multilevel Architectures for Envelope Amplifier"; pp. 283-289; Jan. 2009; 7 Pages.
Vasić, et al.; "Multilevel Power Supply for High Efficiency RF Amplifiers"; pp. 1233-1238; Jan. 2009; 6 Pages.
Walling, et al.; "A Class-G Supply Modulator and Class-E PA in 130 nm CMOS"; IEEE Journal of Solid-State Circuits; vol. 44; No. 9; pp. 2339-2347; Sep. 2009; 9 Pages.
U.S. Office Action dated Oct. 14, 2021, for U.S. Appl. No. 17/012,821; 14 pages.
Response to U.S. Office Action dated Oct. 14, 2021 for U.S. Appl. No. 17/012,821; Response filed on Jan. 14, 2022; 20 pages.
U.S. Office Action dated Apr. 13, 2022, for U.S. Appl. No. 17/012,821; 14 pages.
Response to U.S. Office Action dated Apr. 13, 2022, for U.S. Appl. No. 17/012,821; Response filed on Sep. 13, 2022; 15 pages.
Notice of Allowance dated Nov. 27, 2023, for U.S. Appl. No. 17/012,821; 10 pages.
Preliminary Amendment filed on May 2, 2023, for U.S. Appl. No. 18/180,886; 11 pages.
U.S. Office Action dated Aug. 3, 2023, for U.S. Appl. No. 18/180,886; 16 pages.
Response to U.S. Office Action dated Aug. 3, 2023, for U.S. Appl. No. 18/180,886; Response filed on Oct. 11, 2023; 13 pages.
Notice of Allowance dated Nov. 27, 2023, for U.S. Appl. No. 18/180,886; 10 pages.
Amendment Under 37 CFR § 1.312 filed on Feb. 5, 2024, for U.S. Appl. No. 18/180,886; 8 pages.
Cao, et al.; "A Family of Zero Current Switching Switched-Capacitor DC-DC Converters"; 2010 Twenty-Fifth Annual IEEE Applied Power Electronics Conference and Exposition (APEC); Feb. 21-25, 2010; 8 Pages.
Cao, et al.; "Multiphase Multilevel Modulator DC-DC Converter for High-Current High-Gain TEG Application"; IEEE Transactions on Industry Application; vol. 47; No. 3; May/Jun. 2011; 9 Pages.
Chen, et al.; "A High Efficiency High Power Step-Up Resonant Switched-Capacitor"; 2012 IEEE Energy Conversion Congress and Exposition (ECCE); Sep. 15-20, 2012; 5 Pages.
Shoyama, et al.; "Resonant Switched Capacitor Converter with High Efficiency"; 2004 35th Annual IEEE Power Electronics Specialists Conference; 2004; 7 Pages.
Sun, et al.; "High Power Density, High Efficiency System Two-Stage Power Architecture for Laptop Computers"; 2006 37th IEEE Power Electronics Specialists Conference; Jun. 18-22, 2006; 7 Pages.
Unknown; "Fundamentals of Power Electronics"; Chapter 19: Resonant Conversion; Sep. 19, 2019; 87 Pages.
Yeung, et al.; "Multiple and Fractional Voltage Conversion Ratios for Switched-capacitor Resonant Converters"; 2001 IEEE 32nd Annual Power Electronics Specialists Conference (IEEE Cat. No. 01CH37230); Jun. 17-21, 2001; 6 Pages.

* cited by examiner

SUPPLY GENERATOR AND ASSOCIATED CONTROL METHODS

CROSS REFERENCE TO RELATED APPLICATIONS

This application claims the benefit of U.S. patent application Ser. No. 18/180,886, which was filed on Mar. 9, 2023, which claims the benefit of U.S. patent application Ser. No. 17/012,821, which was filed on Sep. 4, 2020, and issued as U.S. Pat. No. 11,637,531 on Apr. 25, 2023, which claims benefit to U.S. Provisional Patent Application No. 62/896,143 filed Sep. 5, 2019. The contents of the above-referenced applications are hereby incorporated by reference as if fully set forth herein.

BACKGROUND

The efficiency of radio-frequency (RF) power amplifiers (PAs) can be improved through "supply modulation" (or "drain modulation" or "collector modulation"), in which the power supply voltage provided to the PA is adjusted dynamically ("modulated") over time depending upon the RF signal being synthesized. For the largest efficiency improvements, supply voltage can be adjusted discretely (i.e. among discrete voltage levels) or continuously on a short time scale that tracks or dynamically accommodates variations in RF signal amplitude (or envelope), such as may occur as data is encoded in the RF signal or as the RF signal amplitude is desired to be changed with high envelope bandwidth (e.g., as in envelope tracking, envelope tracking advanced, polar modulation, "class G" power amplification, multilevel back-off, multilevel LINC, Asymmetric Multilevel Out-phasing, etc.). The power supply voltage (or voltage levels) provided to the PA may also be adapted to accommodate longer-term changes in a desired RF envelope. This is sometimes referred to as "adaptive bias. Such "longer term changes" may, for example, be associated with adapting transmitter output strength to reduce, and ideally minimize, errors in data transfer, or adapting transmitter output strength for variating in RF "traffic" variations, etc.

"Continuous" supply modulation (e.g., "envelope tracking" or "adaptive bias") may be advantageously realized by dynamically selecting an intermediate voltage from among a set of discrete power supply voltages and then further regulating (e.g. stepping down) this intermediate voltage to create a continuously-variable supply voltage to be provided to the power amplifier. Some RF amplifier systems utilize "discrete" supply modulation (or discrete "drain modulation") in which the supply voltage is switched among a set of discrete voltage levels, possibly including additional filtering or modulation to shape the voltage transitions among levels. Systems of this type are known and include "class G" amplifiers, multi-level LINC (MLINC) Power Amplifiers, Asymmetric Multilevel Out-phasing (AMO) Power Amplifiers, Multilevel Back-off amplifiers (including "Asymmetric Multilevel Back-off" amplifiers) and digitized polar transmitters among other types.

Hybrid systems which utilize a combination of continuous and discrete supply modulation may also be realized. FIG. 1 shows an overview of an illustrative system architecture for a RF amplifier system utilizing supply modulation wherein a supply modulator switches among multiple voltages generated by a multiple-output supply generator. (Not shown are aspects of signal processing and control for such a system). Also shown in FIG. 1 is an example implementation of an architecture which is especially suitable for discrete supply modulation.

SUMMARY

Described are concepts, systems, circuits and techniques for power management. In particular, described are concepts, systems, circuits and techniques for power management directed toward innovations in the design and control of supply generators including multiple-output supply generators. The concepts, systems, circuits and techniques described herein find use in a wide variety of applications including, but not limited to mobile handset applications as well as numerous other power management applications.

In accordance with one aspect of the concepts described herein a technique for control a magnetic regulation stage includes turning on a first group of switches of the magnetic regulation stage to implement the an intended operating mode; and in response to a condition not being met for transition to a second phase of the first operating mode, automatically entering at least one intermediate N-phase mode by turning on at least a selected second, different group of switches.

With this particular arrangement, a control approach allows more efficient energy transfer from the input of the magnetic regulation stage to the output of the magnetic regulation stage, particularly for voltage conversion ratios near unity is provided.

In embodiments, described are improvements in the design and control of multiple-output supply generators and their use in multiple-level power supplies for radio frequency (RF) systems including but not limited to RF power amplifier (PA) systems. Aspects of these advances may be particularly valuable where some form of buck-boost power conversion is required (e.g., synthesizing output voltages that may fall above or below an available input voltage). The described concepts, systems, circuits and techniques can also be applied to other applications in which buck-boost power conversion is employed.

In accordance with one aspect of the concepts described herein, a multiple-output supply generator includes a magnetic regulation stage coupled to a multiple-output switched-capacitor circuit. The magnetic regulation stage regulates one supply generator output which is also the input of the switched-capacitor circuit, while the switched-capacitor circuit supplies other output(s) of the multiple-output supply generator. The magnetic regulation stage is configured to operate in at least one intermediate phase between a first phase and a final phase of a magnetic regulation stage operating mode.

With this particular arrangement, a multiple-output supply generator suitable for use as part of an RF amplifier system is provided. With a magnetic stage controllable to regulate voltages at one or more outputs of the multiple-output supply generator while voltages at the other outputs of multiple-output supply generator (i.e. the ones of the outputs not controlled by magnetic stage) are determined by the operation of the switched-capacitor stage, a flexible multiple-output supply generator is provided. Furthermore, by utilizing multiple voltages provided by the switched-capacitor stage, the stress on devices (e.g. active devices) and inductive elements in the magnetic regulation stage are reduced. In embodiments, magnetic regulation stage may be provided as a buck-boost magnetic regulation stage.

In accordance with a further aspect of the concepts described herein, a hybrid magnetic/switched-capacitor multiple-output supply generator includes a multi-output switched-capacitor stage and a magnetic regulation stage that taps into two or more ports of the switched-capacitor stage.

With this particular arrangement, a multiple-output supply generator having buck-boost capability with reduced device and inductor stress as compared to prior art approaches is provided.

In accordance with a still further aspect of the concepts described herein, a hybrid magnetic/switched-capacitor multiple-output supply generator includes a multi-output switched-capacitor stage and a magnetic regulation stage. The magnetic regulation stage comprises an inductive element having first and second terminals and means for switching one or both terminals of the inductive element to multiple ports of the switched-capacitor stage.

With this particular arrangement, a multiple-output supply generator having reduced inductor stress/size, wider operating range capability, improved efficiency and better control characteristics is provided.

In accordance with a further aspect of the concepts described herein, a method for controlling a magnetic regulation stage having a first operating mode and a second, final operating mode within a switching cycle of the magnetic regulation stage comprises turning on a first group of switches of the magnetic regulation stage to implement an intended operating mode; and in response to a condition not being met for transition to a second phase of the first operating mode, automatically entering at least one intermediate N-phase mode by turning on at least a selected second, different group of switches.

In embodiments, the method further comprises selecting an intended operating mode. In embodiments, selecting an intended operating mode comprises selecting an intended operating mode while considering one or more of: hysteresis of signals; and hysteresis of conversion ratios.

In embodiments, selecting an intended operating mode further comprises placing minimum and/or maximum durations for dwelling in a mode once it has been selected.

In accordance with a further aspect of the concepts described herein, an N-phase control method for a magnetic stage comprises at the start of a cycle, turning on switches for initiation of one of: a buck mode of operation and a boost mode of operation; in response to a desired condition not being met within a specified time or within a specified duty ratio, automatically entering one of: an N-phase buck+buck-boost mode and in which switch configurations are changed to provide boosting capability; or an N-phase boost+buck-boost mode in which the switch configurations are changed to provide buck capability.

In embodiments, in response to the desired condition being reached, entering a final switch state for the magnetic regulation stage switching cycle.

In accordance with a still further aspect of the concepts described herein, a tri-phase control method for a magnetic stage comprises at the start of a cycle for a first phase, turning on a first set of switches in the magnetic stage to implement a buck-mode during the first phase at the start of the cycle; observing a current $i_L$ though an inductor in the magnetic stage; comparing the observed inductor current $i_L$ to at least one of: a reference peak current $i_p$ or a peak current $i_p$ minus a compensating ramp; in response to the inductor current $i_L$ reaching one of the reference peak current $i_p$ or the peak current $i_p$ minus a compensating ramp before reaching an on-time duration $D_{um}T$, turning on a second of switches to enter phase 2 of the cycle; in response to the on time duration of phase 1 exceeding a specified value ($D_{um}T$) before the inductor current $i_L$ reaches one of the reference peak current $i_p$ or the peak current $i_p$ minus a compensating ramp, ending phase 1 and automatically turning on a third set of switches to enter a buck+buck-boost mode.

In embodiments, in response to the inductor current $i_L$ reaching one of the reference peak current $i_p$ or the peak current $i_p$ minus a compensating ramp while in the buck+buck-boost mode, turning on a second of switches to enter phase 2 of the cycle.

In embodiments, the method further comprises making a decision at the beginning of a switching cycle based on one or more inputs to initiate the cycle in either (1) buck mode or (2) boost mode.

In embodiments, the method further comprises operating the boost mode in valley current mode control.

In embodiments, the method further comprises providing an offset in the current-mode compensator that differs depending upon whether the cycle is initiated in buck mode or boost mode.

In embodiments, automatically turning on a third set of switches to enter a buck+buck-boost mode comprises changing a switch configuration of the magnetic stage to implement a boost state.

In accordance with a still further aspect of the concepts described herein, a tri-phase control method for a magnetic stage comprises at the start of a cycle for a first phase, turning on a first set of switches in the magnetic stage to implement a boost-mode during the first phase at the start of the cycle; observing a current $i_L$ though an inductor in the magnetic stage; comparing the observed inductor current $i_L$ to at least one of: a reference peak current $i_p$ or a peak current $i_p$ minus a compensating ramp; in response to the inductor current $i_L$ reaching one of the reference peak current $i_p$ or the peak current $i_p$ minus a compensating ramp before reaching an on-time duration $D_{um}T$, turning on a second of switches (e.g., $q_B$, $q_D$) to enter phase 2 of the cycle; and in response to the on time duration of phase 1 exceeding a specified value ($D_{um}T$) before the inductor current $i_L$ reaches one of the reference peak current $i_p$ or the peak current $i_p$ minus a compensating ramp, ending phase 1 and automatically turning on a third set of switches to enter a boost+buck-boost mode.

In embodiments, automatically turning on a third set of switches to enter a boost+buck-boost mode comprises changing a switch configuration of the magnetic stage to implement a buck state.

BRIEF DESCRIPTION OF THE DRAWINGS

The foregoing features may be more fully understood from the following description of the drawings in which.

DETAILED DESCRIPTION

Described in conjunction with FIGS. 2-13 are concepts, circuits, systems and techniques useful in the design and control of supply generators, including but not limited to multiple-output supply generators, which may be useful in a wide variety of applications including, but not limited to wireless applications and mobile applications. It should be noted that while particular example are described herein, such examples are provided only to promote clarity in the broad concepts sought to be protected and are not intended as and should not be constructed as limiting rather it should be appreciated that the concepts, techniques, systems and circuits as described herein, can also be used and/or adapted and/or applied in numerous other power management applications.

Figure 2:
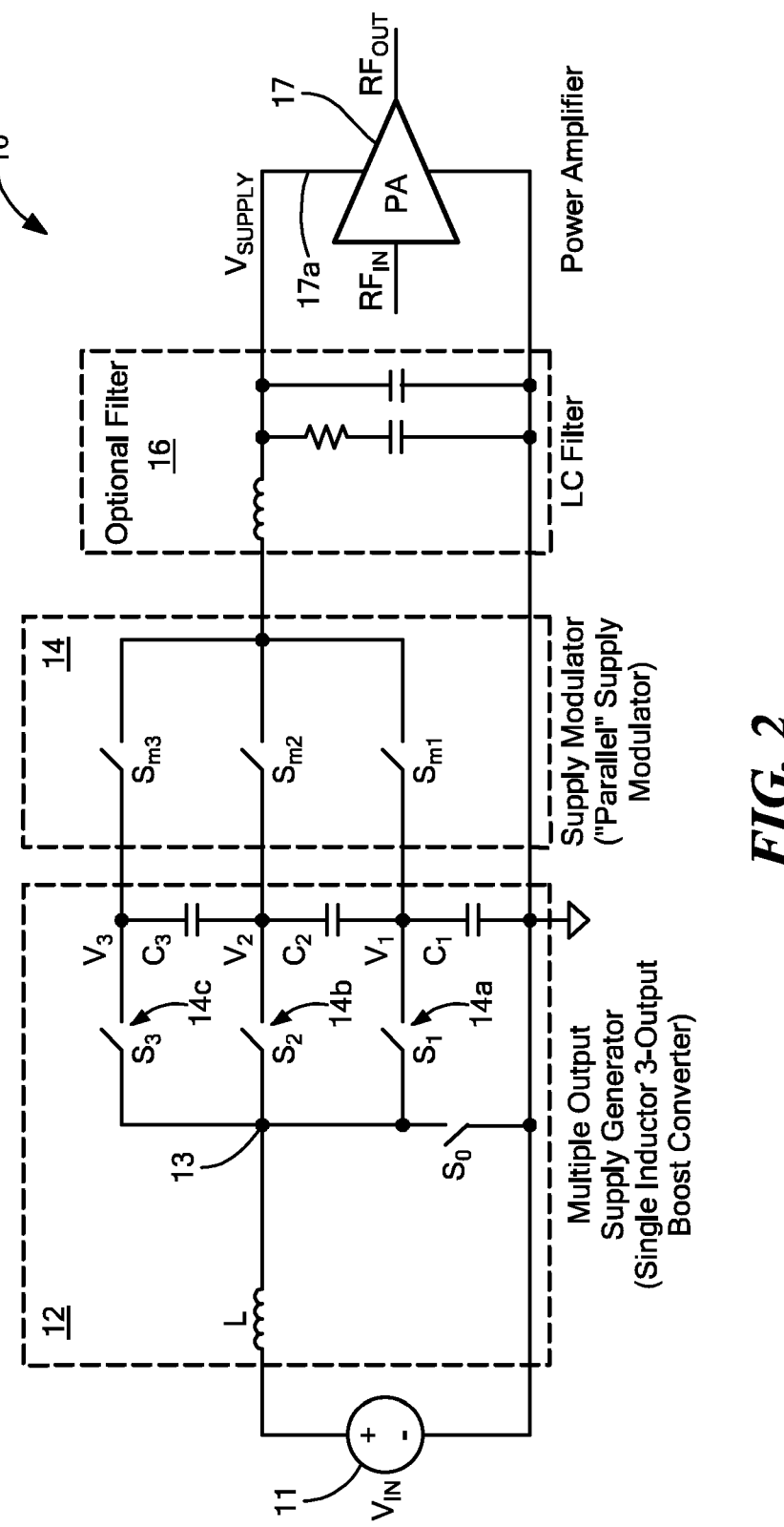
FIG. 2 is a block diagram of an example RF amplifier system including a multiple-output supply generator comprising a single-inductor multiple-output boost converter, a parallel supply modulator and an LC filter.

Referring now to FIG. 2, a radio frequency (RF) transmit system 10 includes a multiple-output supply generator (here shown as a single-inductor multiple-output boost converter), a parallel supply modulator 15 and an optional filter 16 (here illustrated as an LC filter). In general overview, the multiple-output supply generator 12 has an input configured to be coupled to an energy source 11 (here illustrated as a direct current (DC) voltage source) and multiple-output supply generator 12 generates multiple voltages at outputs thereof. The multiple-output supply modulator 15 switches among the multiple voltages generated by the multiple-output supply generator 12. An output of the parallel supply modulator 15 is coupled to a supply terminal 17a of a power amplifier 17. Thus, supply modulator 15 provides supply voltages to power amplifier supply terminal 17a.

Multiple-output supply generator 12 comprises an inductive element illustrated in FIG. 2 as a single inductor L having a first (or input) terminal coupled to energy source 11 and a second (or output) terminal coupled to a first terminal or node 13 of a switch network comprising switches S1, S2, S3 which provide a plurality of switchable signal paths. In this example, the switch network comprises three signal paths (or "branches") 14a, 14b, 14c each of which comprises at least one switch. In this example embodiment signal path 14a includes switch $S_1$, signal path 14b includes switch S2 and signal path 14c includes switch S3. A first terminal of each switch is coupled to node 13. Multiple-output supply generator further comprises a fourth switch S4 having a first terminal couple to node 13 and a second terminal coupled to ground. Multiple-output supply generator also includes a capacitor stack comprising a plurality of capacitors. In this example, the capacitor stack comprises three (3) capacitor $C_1$, C2, C3 with capacitor $C_1$ having a first terminal coupled to a second terminal of switch $S_1$. Capacitor C2 has a first terminal coupled to the second terminal of capacitor $C_1$ and a second terminal coupled to a first terminal of capacitor C3. A second terminal of capacitor C3 is coupled to a second terminal switch S3.

Figure 1:
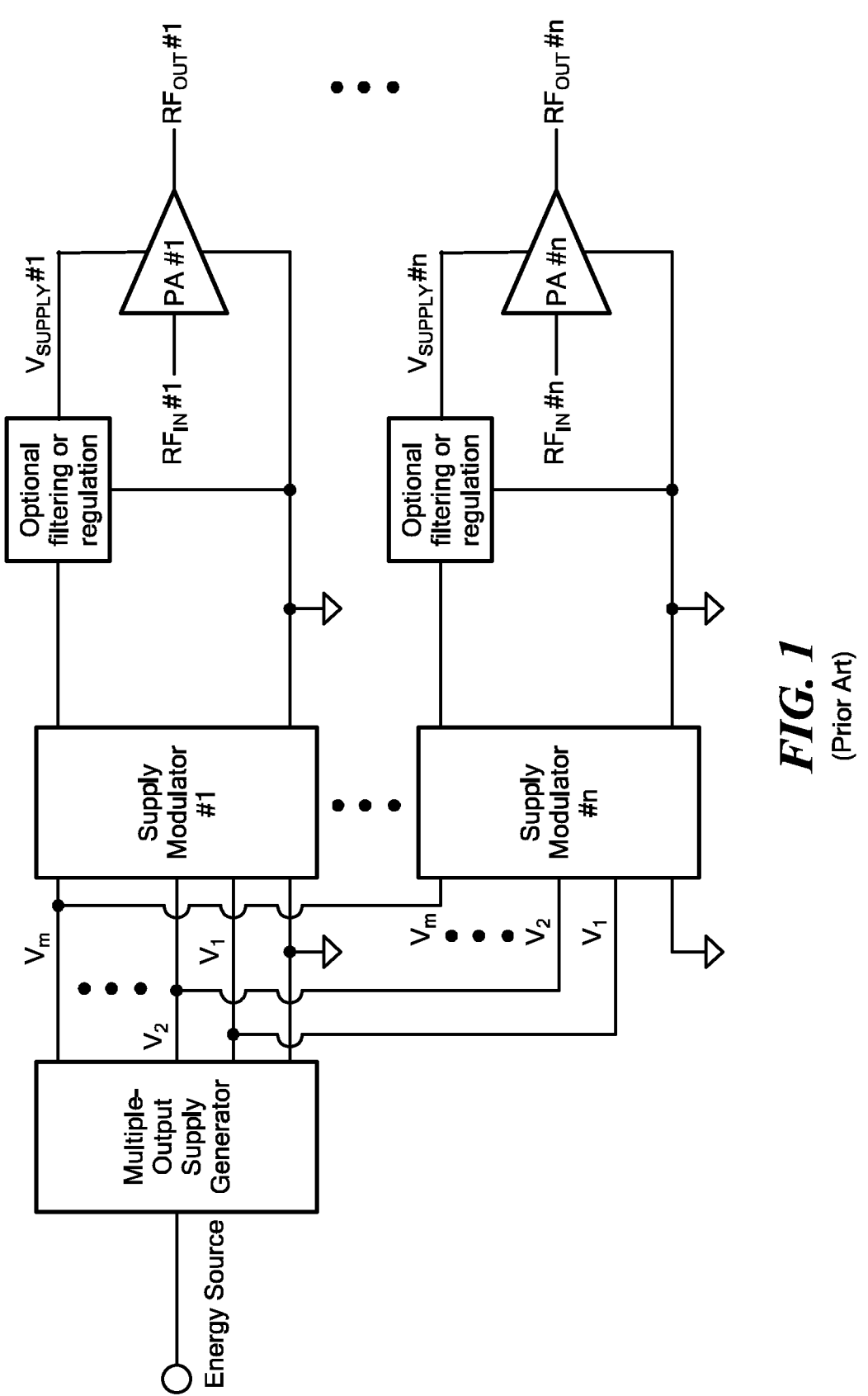
FIG. 1 is a block diagram of a radio frequency (RF) power amplifier (PA) system utilizing multiple supply levels.

The RF systems in FIGS. 1 and 2 (which may, for example, be an RF power amplifier systems) illustrate two subsystems: (1) a "supply generator" that can synthesize multiple power supply voltages from a single input source, and possibly regulate one or more of those power supply voltages, and (2) one or more "supply modulators" that can switch among the power supply voltages provided by the supply generator at rates which enable a modulated supply voltage to be provided to an RF amplifier (which may, for example, be an RF power amplifier).

The particular manner in which the supply generator and supply modulator subsystems 12, 20 are realized may depend upon a variety of factors including, but not limited to: the power level, voltage level and application space of the RF amplifier system.

In accordance with the concepts described herein, however, for many mobile applications, it may be desirable to monolithically integrate electronic elements of both the supply generator and supply modulator on a single semiconductor die (e.g., in a CMOS process). Furthermore, in some cases it may be desirable to integrate electronics for a multiple-output supply generator, supply modulator(s) and power amplifiers on a single die. In other cases, it may be desirable to realize the semiconductor elements for a multiple-output supply generator and (one or more) supply modulators on separate semiconductor dies to enable placement of these elements in desired or particular locations within a system module. In yet other cases (especially at high power), it may be desirable to implement the subsystems with discrete components connected on one or more printed circuit boards. It should be appreciated that a variety of different switching circuits may be utilized to realize the supply modulator subsystem.

As will be described herein, multiple-output supply generators may be realized through a variety of methods. For example, supply generators may be realized using multiple separate converters, multiple-output magnetic converters, multiple-output switched-capacitor converters and hybrid magnetic/switched-capacitor converters providing a ratiometric set of output voltages, and hybrid magnetic switched-capacitor converters that provide other distributions of multiple output voltages.

As will also be described herein, many useful supply generator designs may use a magnetic regulation stage that can provide one or more regulated output voltages from a variable input voltage (e.g., such as a battery). Further output voltages may be synthesized, e.g., by some additional power conversion circuitry such as switched-capacitor circuits, additional switched-mode magnetic power converter(s), by linear regulator(s), etc.

Figure 3:
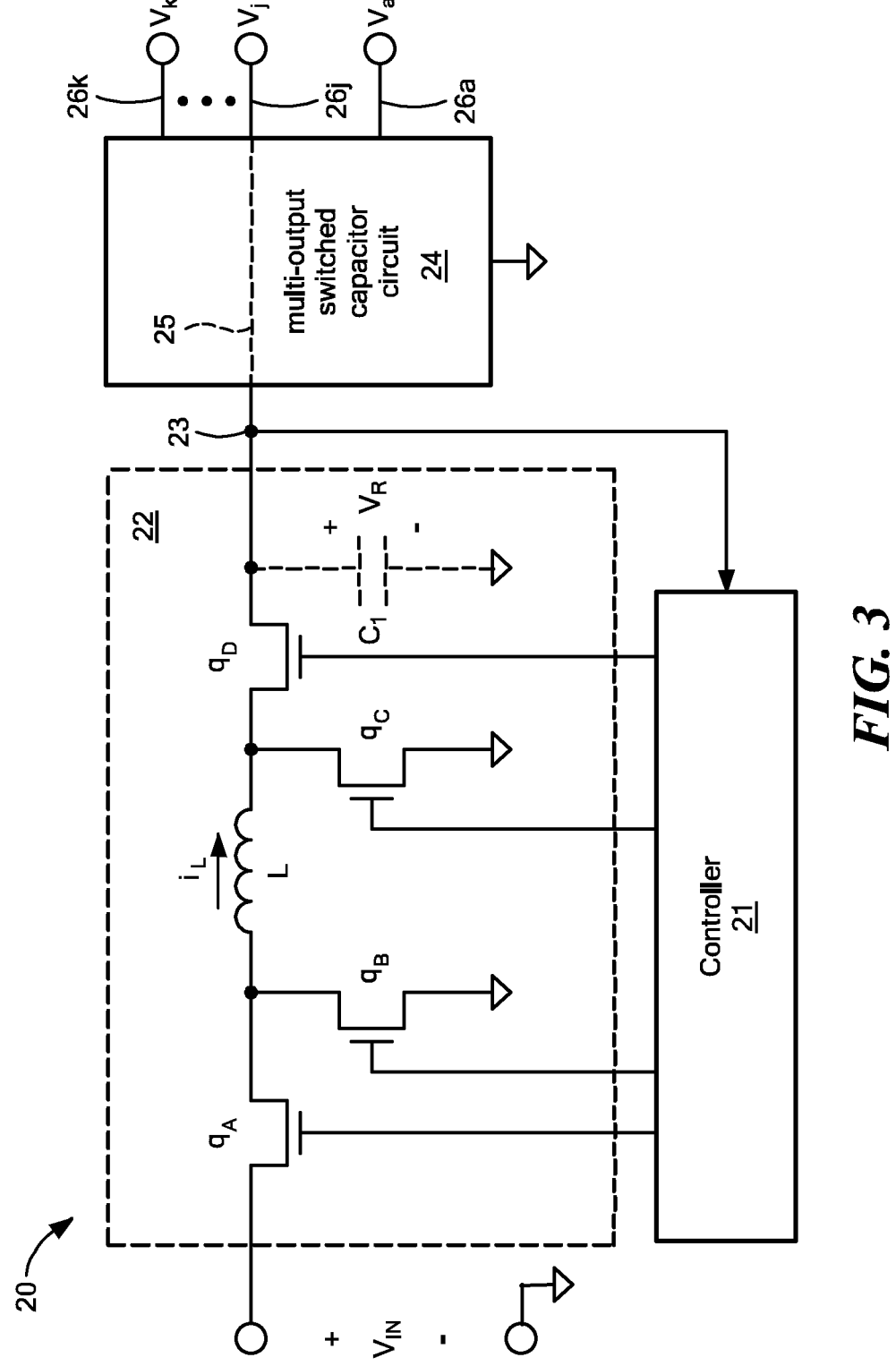
FIG. 3 is a partial schematic diagram of a multiple-output supply generator comprising a magnetic regulation stage followed by a multiple-output switched-capacitor circuit.

FIG. 3, for example, shows a multiple-output supply generator 20 comprising a buck-boost magnetic regulation stage 22 (herein illustrated as a 4-switch buck-boost magnetic regulation stage) followed by a multiple-output switched-capacitor circuit 24. In general overview, the magnetic regulation stage 22 regulates one supply generator output which is also the input of the switched-capacitor circuit 24, while the switched-capacitor circuit 24 supplies other output(s) of the multiple-output supply generator. This design is suitable for use as part of an RF amplifier system such as the systems illustrated in FIGS. 1 and 2.

In particular, magnetic regulation stage 22 establishes a voltage $V_R$ at an output 23 of magnetic regulation stage 22 and coupled to one of the supply generator outputs via path 25 and is also coupled to the input of the switched-capacitor circuit 24. In this example embodiment, voltage $V_R$ is established across an optional capacitor C1. It should be appreciated that capacitor C1 may be internal or external to the magnetic regulation stage 22 (i.e. capacitor C1 may or may not be considered to be a part of the magnetic regulation stage 22).

Magnetic regulation stage output 23 is coupled back to controller 21. Thus, controller 21 receives a feedback signal.

Although in this example embodiment, controller 21 is shown coupled to magnetic regulation stage output 23, in embodiments controller 21 may detect one or more of: magnetic regulation stage input signals; magnetic regulation stage output signals; one or more reference signals; or one or more target signals. In embodiments, the signals detected or otherwise provided to controller 21 may be discrete time signals (i.e. digital signals) or continuous time signals (i.e. analog signals). In embodiments, the input/output signals may comprise one of: a measured input/output voltage; or a measured input/output current; or a measured inductor current. In embodiments, the one or more reference signals may comprise: one or more reference voltages or one or more reference currents. In embodiments, the one or more target signals may comprise: one or more target voltages or one or more target currents. In embodiments, the signals can be voltage signals or current signals and may be measured signals, estimated signals or derived signals. One example of a derived signal is an actual (e.g. measured) current signal (e.g. $i_L$) combined with a compensation signal (e.g. some computed current signal which may then be combined with the current signal $i_L$). Another example of a derived signal is a actual (e.g. measured) voltage signal combined with a compensation signal (e.g. some computed voltage signal which may then be combined with the voltage signal).

Switched-capacitor circuit 24 supplies at least some of the other ones of the output(s) of the multiple-output supply generator 20. That is, switched-capacitor circuit 24 is configured to supply at least some of the outputs of the multiple-output supply generator $V_1$-$V_k$ not being supplied via the magnetic regulation stage 22 output. The ones of the output voltages $V_1$-$V_K$ provided by switched-capacitor circuit 24 may be ratiometrically related to some reference voltage. For example, ones of the output voltages $V_1$-$V_K$ provided by switched-capacitor circuit 24 may be ratiometrically related to the voltage $V_R$ regulated by the magnetic regulation stage. Thus, magnetic stage 22 can be controlled to regulate voltages at least one output (at a time) while the voltages at the other outputs $V_1$-$V_k$ (i.e. the ones of the outputs $V_1$-$V_k$ not controlled by magnetic stage 22) are determined by the operation of the switched-capacitor stage 24.

In embodiments, output 23 may be coupled (either directly or indirectly) to one of the supply generator outputs 26a-26K thereby coupling voltage $V_R$ to the one of the supply generator outputs. For example, in one illustrative embodiment and as schematically illustrated in FIG. 3, if node 23 (at which voltage $V_R$ exists) is coupled to supply generator output 25j then voltage level $V_j$ corresponds to voltage level $V_R$. In embodiments, one may choose not to couple output 23 to any of the supply generator outputs 26a-26K.

In embodiments, output 23 may be selectively coupled to one or more of the supply generator outputs thereby coupling voltage $V_R$ to the selected one of the K supply generator outputs 26a-26K where K is an integer greater than two (2). In embodiments, voltage V5 may be coupled to other ones of outputs 26a-26K. Illustrative embodiments will be described below in conjunction with FIGS. 4, 4A and 5.

It should be appreciated that for a given set of magnetic regulation stage circuit devices and elements (e.g. magnetic regulation stage 22 transistors $q_A$-$q_D$ and inductive element L) having specified voltage and current ratings (or limits) it is possible to reduce the stress on these circuit devices and elements by utilizing the multiple voltages provided by the switched-capacitor stage 24. That is, by utilizing the multiple voltages provided by the switched-capacitor stage 24, the voltage across the magnetic stage circuit devices and currents through inductive elements are less than the voltages and currents which would appear across the magnetic stage circuit devices and elements, respectively without the use of multiple voltages. Since the voltages and currents which appear across the magnetic stage circuit devices and elements are less with the use of multiple voltages, the magnetic stage circuit devices and elements are said to be less stressed (i.e. the stress on these circuit devices and elements is less than what would exist without the use of multiple voltages).

For example, coupling transistors $q_B$, $q_C$ to node V2 reduces the voltage stress on magnetic regulation stage transistors $q_A$-$q_D$ since the voltage appearing across the transistors in the magnetic regulation stage is the difference between voltage V5 and voltage V2. This is in contrast to the earlier described approach which does not utilize multiple voltages and thus the full voltage V5 is across the magnetic regulation stage transistors. For this same reason, currents through magnetic stage inductive elements (e.g. inductor L) are also reduced with the multiple voltage approach.

Alternatively, utilizing the multiple voltages provided by the switched-capacitor stage 24 allows selection of transistors and inductors having lower voltage and current ratings (i.e. inductors having a current rating or inductance value which is lower than the current rating needed for inductors in a system which does not utilize multiple voltages. For example, a CMOS power FET may have an associated maximum drain to source voltage (which in some MOSFETs may be rated voltages such as 1.8 V, 3.3 V or 5 V) and exceeding this limit can result in destruction of the device. Furthermore, a high gate to source voltage typically reduces (and in some cases significantly reduce) the lifetime of the MOSFET. Also, a power MOSFET may have a maximum specified drain to source voltage (when turned off), beyond which breakdown may occur. Exceeding the breakdown voltage causes the device to conduct, potentially damaging it and other circuit elements due to excessive power dissipation. Thus, it is favorable to reduce stress on a component.

Figure 3A:
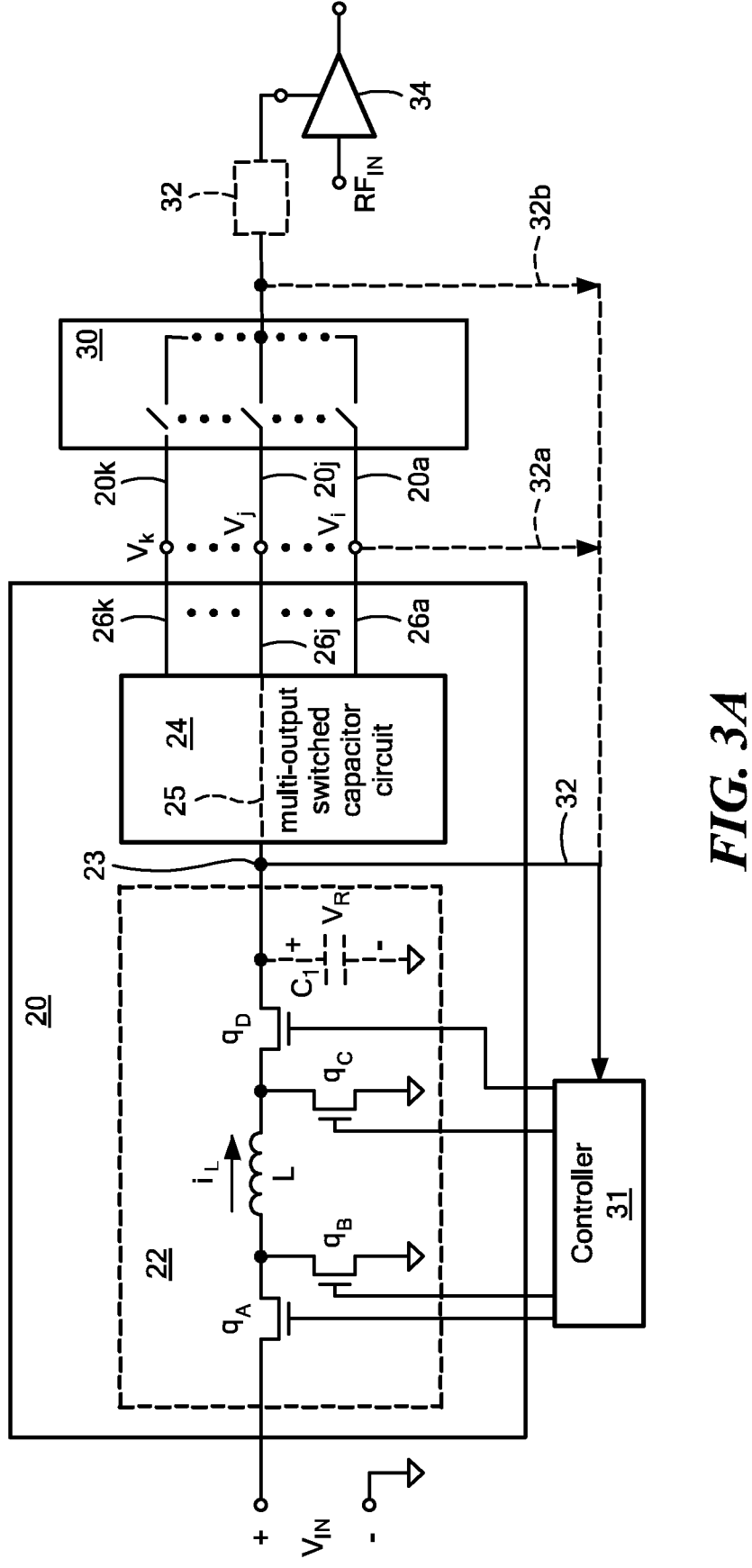
FIG. 3A is a block diagram of an RF system comprising a multiple-output supply generator.

Referring now to FIG. 3A in which like elements of FIG. 3 are provided having like reference designations, an RF system comprises a multiple-output supply generator 20 has an input configured to be coupled to an energy source (here illustrated as an input voltage $V_{IN}$ which may be a DC voltage source). In the manner described above in conjunction with FIG. 3, multiple-output supply generator 20 generates multiple voltages at outputs 20a-20K thereof. Briefly, magnetic regulation stage 22 establishes a voltage which is provided both to an input of a multi-output port switched-capacitor circuit 24 and to at least one of the multiple-output supply generator outputs 20a-20K. Multi-output port switched-capacitor circuit 24 generates additional voltages available at other one(s) of multiple-output supply generator outputs 20a-20K. A switched multiple-output supply modulator 30 switches among the multiple voltages generated by the multiple-output supply generator 20. An output of supply modulator 30 is coupled to a supply terminal 34a of a power amplifier 34. Thus, supply modulator 30 provides supply voltages to supply terminal 34a of power amplifier 34.

In this example embodiment, a controller 31 may receive one or more feedback signals from any or all of: magnetic regulation stage output via signal path 32; one or more outputs of multi-output switched capacitor circuit 24 via signal paths 32a (with only one path 32a being shown in FIG. 3A for clarity); one or more outputs of supply modulator circuit 30 via signal path 32b. Controller 31 may also receive one or more feedback signals from the RF output of amplifier 34.

Thus, as noted above controller 31 may detect one or more of: magnetic regulation stage input signals; magnetic regulation stage output signals; one or more reference signals; or one or more target signals. In embodiments, the signals detected or otherwise provided to controller 31 may be discrete time signals (i.e. digital signals) or continuous time signals (i.e. analog signals). In embodiments, the input/output signals may comprise one of: a measured input/output voltage; or a measured input/output current or another current such as an inductor current. In embodiments, the one or more reference signals may comprise: one or more reference voltages or one or more reference currents. In embodiments, the one or more target signals may comprise: one or more target voltages or one or more target currents. In embodiments, the signals can be voltage signals or current signals and may be measured signals, estimated signals or derived signals.

In response to the one or more feedback signals received, detected or otherwise provided to controller 31, the controller 31 provides control signals to switching elements (here shown as field effect transistors (FETs) $q_A$, $q_B$, $q_C$, $q_D$) of magnetic regulation stage 22. A variety of control schemes will be described below in conjunction with FIGS. 7-9A.

Figure 4:
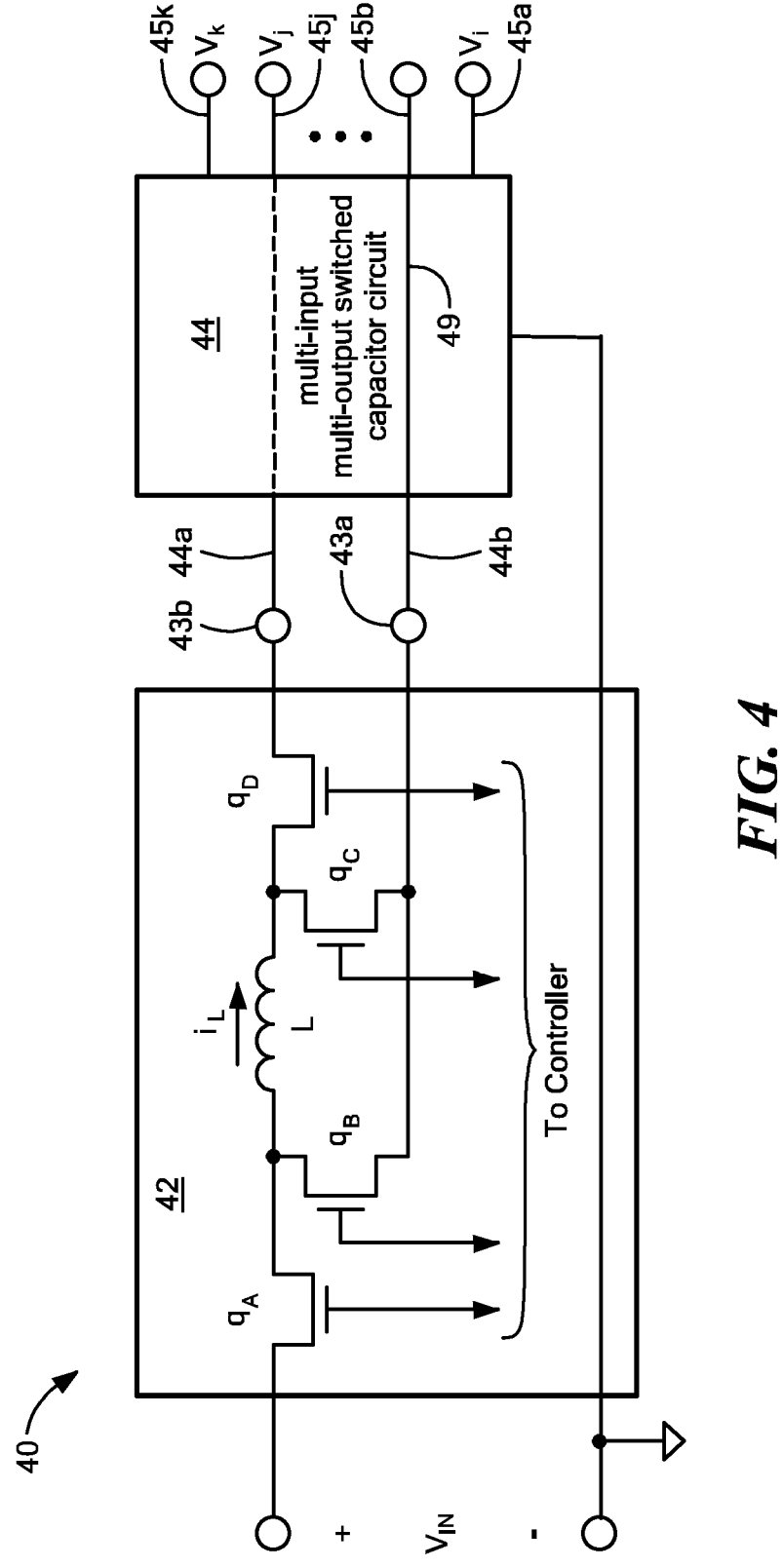
FIG. 4 is a schematic diagram of an illustrative hybrid magnetic/switched-capacitor multiple-output supply generator.

Referring now to FIG. 4 a multiple-output supply generator 40 having a hybrid magnetic/switched-capacitor architecture comprises a magnetic regulation stage 42 having a pair of outputs 43a, 43b coupled to corresponding inputs 44a, 44b of a multi-output switched-capacitor stage 44. It should be appreciated that while in this example embodiment, a pair of magnetic regulation stage outputs 43a, 43b are coupled to respective ones of a pair of multi-output switched-capacitor inputs 44a, 44b, in other embodiments, a magnetic regulation stage may be provided having more than two outputs (i.e. three or more outputs) which are coupled to a corresponding number of inputs of a switched-capacitor stage.

In the example embodiment of FIG. 4, however, the two magnetic regulation stage outputs 43a, 43b tap into two ports 44a, 44b of the switched-capacitor stage 44 to realize buck-boost capability. Thus, as noted above, while the embodiment of FIG. 3 results in reduced device and inductor stress as compared to the systems of FIGS. 1 and 2, the embodiment of FIG. 4 results in reduced device and inductor stress as compared to the embodiment of FIG. 3. This reduced stress can significantly benefit supply generator efficiency and performance of the multiple-output supply generator. Efficiency is improved relative to prior art techniques because, for the reasons explained above, for the same application, it is possible to utilize transistors having lower voltage ratings with less loss. Also, for the reasons explained above, for the same application smaller inductors (and smaller-valued inductors) can be used (due to less current ripple with the multiple voltage approach described above) which also results in less loss. Moreover, the proposed control approach allows more efficient energy transfer from the input of the magnetic regulation stage to the output of the magnetic regulation stage, particularly for voltage conversion ratios near unity.

Figure 4A:
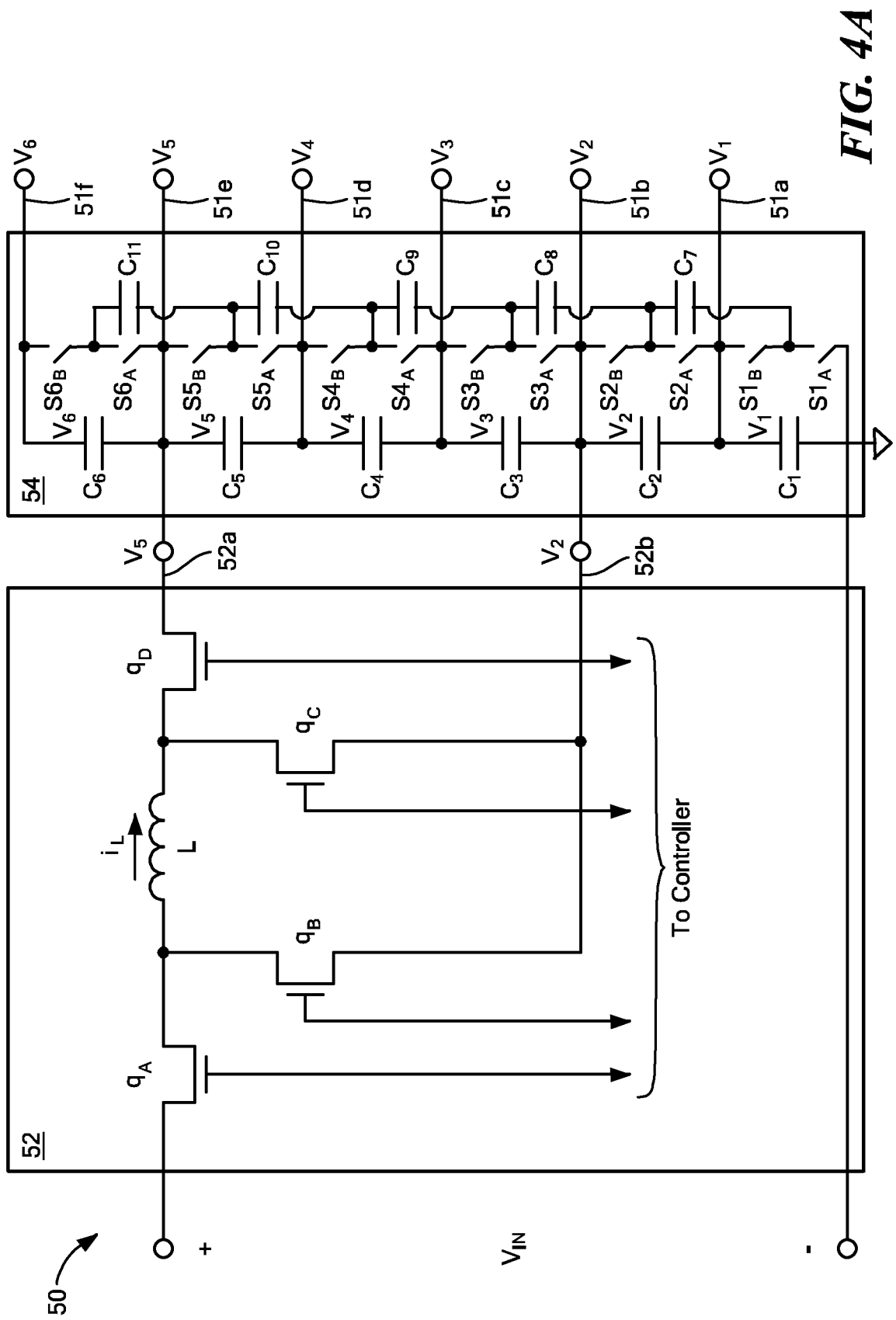
FIG. 4A is a schematic diagram of an example implementation of the circuit of FIG. 4 in which the magnetic regulation stage is referenced to particular voltage levels of the multiple-output magnetic stage.

FIG. 4A shows a particular implementation (or embodiment) of a multiple-output supply generator 50 using an architecture which may be the same as or similar to the architecture illustrated in FIG. 4. In the particular embodiment of FIG. 4A, multiple-output supply generator 50 generates six (6) discrete voltage levels V1-V6 at respective ones multiple-output supply generator outputs 51a-51f.

Multiple-output supply generator 50 comprises a magnetic regulation stage 52 which provides a first and second voltage levels at outputs 52a, 52b. In this example embodiment multiple-output magnetic stage provides voltage level 2 at output 52b and voltage level 5 at output 52a of the multiple-output magnetic stage. It should, of course, be appreciated that while in this example multiple-output magnetic stage 52 provides voltage levels 2 and 5 at respective ones of outputs 52a, 52b, in other examples and multiple-output magnetic stage 52 may provide other levels. For example, multiple-output magnetic stage 52 may provide any one of voltage levels V1-V6 at output 52a and a different one any of any of voltage levels at output 52b V1-V6.

Outputs 52a, 52b of magnetic regulation stage 52 ae coupled to inputs of a multi-output switched-capacitor stage 54, the outputs of which correspond to multiple-output supply generator outputs 51a-51f. In the example of FIG. 4A, multi-output switched-capacitor stage 54 comprises a non-interleaved switched-capacitor circuit comprising a first capacitor stack comprising capacitors C1-C6, a second capacitor stack comprising capacitors C7-C11 and switches S1A, S1B-S6A, S6B coupled to allow capacitors C7-C11 to be switched into and/or out of the first capacitor stack.

Such a circuit architecture can achieve both buck and boost capability at voltage level $V_5$ with respect to the input voltage $V_{in}$, with the outputs $V_1$-$V_6$ ratiometrically related to voltage level $V_5$ by the relation $V_k=(k/5)\cdot V_5$. It should be noted that while FIG. 4A shows a non-interleaved switched-capacitor circuit, an interleaved version could likewise be utilized. Thus, a trade-off may be made between numbers of components and improved capacitor size and/or ripple.

Figure 5:
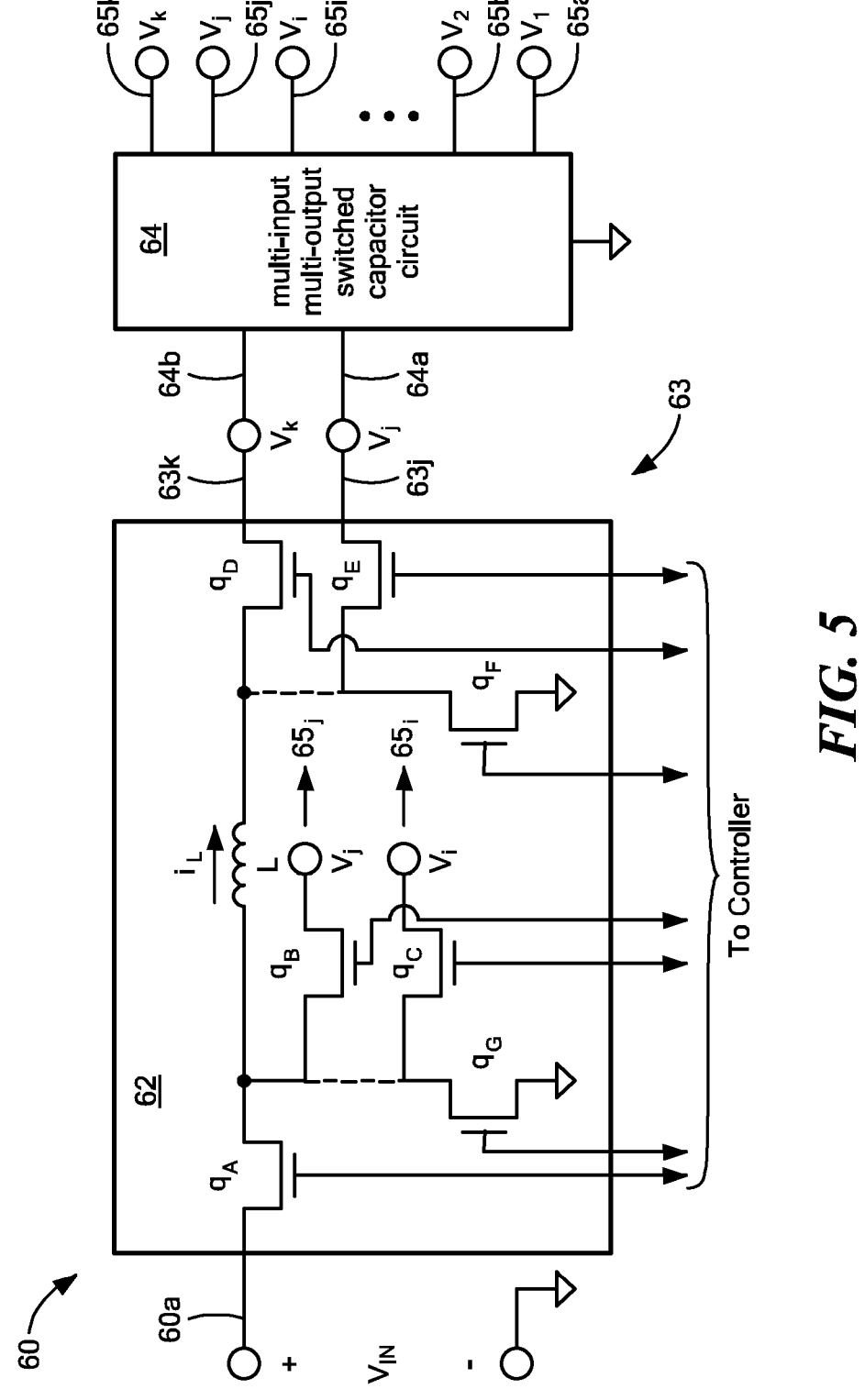
FIG. 5 is a schematic diagram of an example hybrid magnetic/switched-capacitor multiple-output supply generator.

Referring now to FIG. 5, a multiple-output supply generator 60 (or more simply "multi-output supply generator") comprising a magnetic regulation stage 62 comprising a first switch $q_A$ serially coupled between multiple-output supply generator input 60a and a first terminal of an inductor L. One or more switches (with two switches $q_B$, $q_C$ being shown in this illustrative embodiment, couple the first terminal of an inductor L to respective ones of ones of magnetic regulation stage outputs generally denoted 63. In this example, switch $q_B$ couples the first terminal of inductor L to magnetic regulation stage output 63j and switch $q_C$ couples the first terminal of inductor L to magnetic regulation stage outputs 63i.

One or more switches (with two switches $q_D$, $q_E$ being shown in this illustrative embodiment), couple the second terminal of an inductor L to respective ones of magnetic regulation stage outputs. In this example, switch $q_D$ couples the second terminal of inductor L to magnetic regulation stage output 63K and switch $q_E$ couples the second terminal of inductor L to magnetic regulation stage output 63j.

Switch $q_E$ couples the second terminal of inductor L to a reference potential, with the reference potential here being shown as ground.

With this configuration, magnetic regulation stage 62 can switch each terminal of the inductor L to multiple ports (or inputs/outputs) of a switched-capacitor stage 64. In some embodiments, it may be desirable or necessary for only one terminal of the inductor (i.e. either he first terminal or the second terminal, but no both terminals) to be switchably coupled among multiple ports of the switched-capacitor stage (e.g. via a switching element). Thus, it should be appreciated that in some embodiments, it may be desirable or necessary that only one terminal of the inductor can switch among multiple ports of the switched-capacitor stage while in other embodiments it may be desirable or necessary that both terminals of the inductor can be switched (e.g. as illustrated in FIG. 5).

In the example embodiment of FIG. 5, the switches $q_A$, $q_B$, $q_C$, $q_D$, $q_E$ are illustrated as individual transistors. It is, of course, recognized that the individual switch implementations could be realized in any manner which allows correct voltage blocking and current carrying capabilities. That is, any suitable switching element may be used.

This example implementation of FIG. 5 allows flexible energy transfer between the input and the switched-capacitor stage as compared to that allowed by the example circuits described in conjunction with FIG. 3 or 4, for example. The example circuit design illustrated in FIG. 5 can offer reduced inductor stress/size compared with the prior art approaches such as those shown in FIGS. 1 and 2, wider operating range capability (in terms of power and voltage) compared with the prior art approaches such as those shown in FIGS. 1 and 2, improved efficiency and better control characteristics than ones offering less flexible switching capabilities such as the prior art approaches such as those shown in FIGS. 1 and 2.

For supply generators as described above, it is desirable to provide both very efficient conversion and flexible control over the supply generator outputs for a wide range of input voltages, output voltages and power levels. In many such applications, it is desirable to provide sufficient operating range such that a given voltage level of the multiple-output supply generator can be controlled to be below, above or equal to the input voltage, which may come from a battery.

For example, for a system with six ratiometric outputs powered from an input voltage supplied by a Lithium Ion Battery and charger, an input voltage range of 2.5-5.5 V might be typical, and one might desire to control the highest output voltage of the supply generator $v_6$ anywhere between 3-5.4 V (and, in the special case of ratiometrically-related outputs, with $v_5$ varying between 2.5-4.5 V, $v_4$ varying between 2.0-3.6 V, $v_3$ varying between 1.5-2.7 V, $v_2$ varying between 1.0-1.8 V and $v_1$ varying between 0.5-0.9 V). Thus, if the magnetic regulation stage were set to regulate $v_6$, it would need to regulate $v_6$ to values above, below or at the input voltage. Likewise, the magnetic regulation stage might be designed to regulate the voltage at $v_6$ at times or under some conditions and $V_5$ for others, and in each of these cases there may be buck and/or boost capabilities required. What flexibility there is in achieving this does depend heavily on the magnetic regulation power stage available, e.g. that of FIG. 3, 4, or 5 and how the power stage is controlled to achieve the desired output voltage profile in the face of input voltage variations.

The concepts, systems, circuits and techniques described herein also find application in the design and control of multiple-output supply generators and their use in multiple-level power supplies for RF power amplifier systems. Aspects of these advances are particularly valuable where some form of buck-boost power conversion is required (e.g., synthesizing output voltages that may fall above or below the available input voltage) can also be applied to other applications in which buck-boost power conversion is employed.

Figure 6:
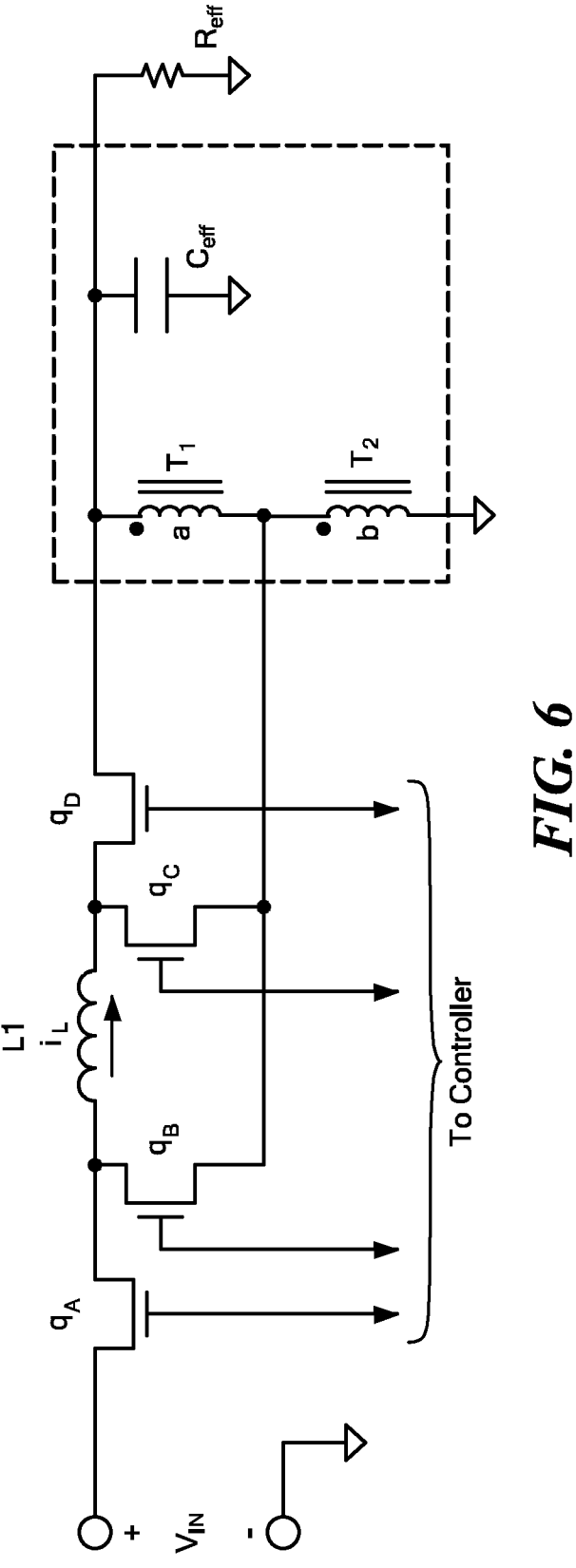
FIG. 6 is a schematic diagram of an example model for a supply generator having a magnetic regulation stage with buck-boost capability.

Referring now to FIG. 6, a model for a supply generator having a magnetic regulation stage with buck-boost capability includes a magnetic regulation stage comprising switches qA, qB, qC, qD and an inductive element L coupled to a switched-capacitor stage comprising an inductive element (here illustrated as an ideal transformer T1, T2) and a capacitor $C_{eff}$. The impact of the switched-capacitor stage on the magnetic regulation stage is modeled with a circuit incorporating an ideal transformer, where the turns on the transformer correspond to the coupling locations of the magnetic regulation stage switches into the switched-capacitor stage.

Regarding magnetic regulation stage switching and control (e.g. via a controller such as controller 31 described above in conjunction with FIG. 3A, consider the magnetic regulation stages of the supply generators in FIGS. 3, 3A and 4. As noted above, the effects of the switched-capacitor stage and load on the magnetic regulator stage can be modeled with an ideal transformer structure and an effective capacitance $C_{eff}$ and resistance $R_{eff}$ as shown in FIG. 6. The turns ratio of the ideal transformer a:b is selected to model the voltages imposed on the magnetic regulation stage by the switched-capacitor stage. For example, if the magnetic regulation stage taps into levels 5 and 2 of the switched-capacitor stage as illustrated in FIG. 4A then a=5 and b=2 in FIG. 6. However, were the magnetic regulation stage to tap into level j and ground as in FIG. 3, then a=j and b=0 in FIG. 6. This enables the behavior of the magnetic regulation stage to be easily modeled.

Consider implementations (e.g., of FIGS. 3, 3A, 4, 4A and 6) in which control of the magnetic regulation stage over a switching cycle is broken up into two phases (each with a pair of switches on) in which the first phase (phase 1) has duty ratio D (with the second phase, phase 2, having duty ratio 1-D). In order to reach periodic steady-state operation, one phase should impose a zero or positive voltage on the inductor (such that $di_L/dt>=0$) and the other phase should impose a zero or negative voltage on the inductor (such that $di_L/dt<=0$), with the steady state voltages such that the average voltage across the inductor over a switching cycle is zero ($<di_L/dt>=0$ where the average < > is taken over a switching cycle.) It should be noted that there are many ways in which the values of the duty ratios are determined (e.g., can be realized through voltage-mode control or through current-mode control, including average, peak and/or valley current-mode control, for example.) For the designs of FIGS. 3, 4, 6 the typical switching possibilities are shown in Table 1.

TABLE 1

| Mode number | Mode use | Phase 1: di/dt >= 0 | Phase 2: di/dt <= 0 |
|---|---|---|---|
| 1 | Buck-derived | $q_A$, $q_D$ on | $q_B$, $q_D$ on |
| 2 | Boost-derived | $q_A$, $q_C$ on | $q_A$, $q_D$ on |
| 3 | Buck-Boost derived | $q_A$, $q_C$ on | $q_B$, $q_D$ on |
| 4 | Bypass | $q_A$, $q_D$ on | $q_A$, $q_D$ on |

Table 1 illustrates two-phase operating modes in continuous conduction mode operation for the magnetic regulation stages of FIGS. 3, 3A, 4, 4A and 6. Values are considered for periodic steady-state operation.

The different two-phase switching patterns in Table 1 provide different capabilities in terms of periodic steady state voltage conversion ratios of the magnetic regulation stage. Mode 1 ("buck") enables a periodic steady-state output voltage (e.g., across $C_{eff}$ in FIG. 6) that is ideally equal to or less than the input voltage $V_{in}$. (In reality, a maximum voltage conversion ratio Vout/Vin of only slightly less than one is achievable owing to drops across switch and inductor resistances.) Mode 2 ("boost") enables an output voltage that is ideally equal to or greater than one. Mode 3 ("buck-boost") can attain output voltages above or below the input voltage, but this mode imposes a relatively high degree of stress and loss on the components for a given conversion ratio as compared to Modes 1 or 2. Thus, if utilized, it can be less efficient and requires larger components than other modes. Mode 4 ("bypass") connects the input to the output, ideally providing a conversion ratio of 1 or slightly less than one due to component voltage drops. It is notable that one cannot in practice achieve regulation of the output voltage to below, at or above the input using only buck and boost operating modes, owing to duty ratio limitations and to parasitic component drops. Some more sophisticated degree of control is therefore desirable to do so.

To enable regulation of the magnetic regulation stage output to below, at, or above the input voltage, different possibilities arise. A first possibility is to utilize buck mode operation for desired output voltages up to some amount below the input voltage, utilize buck-boost mode for output voltages in some range close to the input voltage, and to utilize boost-mode operation for desired output voltages some amount above the input voltage. Hysteresis in switching among operating modes can optionally be employed to reduce mode chatter near boundaries. One limitation of this approach is that it employs the buck-boost operating mode, which is both quite inefficient and requires large component size (e.g., large physical inductor) due to the large amount if indirect energy transfer in this operating mode.

A second possibility is to utilize buck mode operation for desired output voltages up to some amount below the input voltage, boost-mode operation for desired output voltages some amount above the input voltage, and then switch into a bypass mode when the desired output is close to the available input voltage. Hysteresis in switching among operating modes can likewise be employed to reduce mode chatter near boundaries. A major advantage of this possibility is that bypass mode is quite efficient (as it does not incur switching or gating losses) and has low generation of electromagnetic interference (owing to the lack of switching), so provides some desirable system characteristics when it is in effect. A substantial disadvantage of this operating mode, however, is that one does not get to precisely control the output voltage during bypass region operation, which is often undesirable from a systems standpoint.

A third possibility occurs when one has a magnetic regulation stage that can switch at least one terminal of the inductor to multiple ports of the switched-capacitor stage (e.g., as in FIG. 5). In such a case one could adjust which terminal(s) of the switched-capacitor stage are switched between in two-phase operation depending upon the required output voltage. A benefit of this technique is that the magnetic regulation stage can be kept in modes that are efficient and provide regulation (e.g., a buck and/or a boost mode), providing that the connections utilized enable the desired operating range. A disadvantage of this technique is that one may prefer to use the "multiple connections" capability to achieve other goals (e.g., minimizing size/stress of the inductor, expanding operating ranges, etc.).

A fourth possibility is to expand operation of the magnetic regulation stage beyond a two-phase mode of operation to an N-phase mode of operation for at least some desired range of voltage conversion ratios. For example, in embodiments it is possible to utilize 3 or more sets of switch states over a switching cycle of the magnetic regulation stage (i.e. it is it is possible to utilize N sets of switch states over a switching cycle of the magnetic regulation stage where N is an integer greater than or equal to three. Such an operating mode (e.g., using 3 or more sets of switch states) may be referred to as "N-Phase" control. When 3 sets of switch states are used such an operating mode may be referred to as "Tri-Phase" control. N-phase and tri-phase control may be implemented in a variety of ways and several examples are described hereinbelow.

An advantage of such an approach (i.e. the N-phase control approach) is that it can provide more efficient voltage conversion for conversion ratios of <1, =1, and >1 than the above-described first, second and third possibilities while preserving wide operating ranges and low component stress. It would be particularly desirable to accomplish this fourth possibility efficiently and compactly with relatively simple control circuitry that preserves other capabilities that are desired (e.g., current mode control, high regulation bandwidth, simple compensation with smooth mode transitions, etc.) It would likewise be valuable to realize smooth transitions between conventional two-phase control and an N-phase operating mode (e.g. a tri-phase operating mode).

It should be appreciated that although the N-phase operating mode concepts disclosed herein are sometimes described in the context of a tri-phase operating mode, such reference is made only to promote clarity in the description of the broad concepts sought to be protected and are not intended as, and should not be construed as, limiting. Thus, after reading the description provided herein, it will now be apparent to one of ordinary skill in the art that the concepts and techniques described herein can be extended to N-phases per cycle by turning on select groups of switches to implement N sets of different switch states.

In embodiments, a group of switches may comprise one or more switches and preferably comprises two or more switches. Although some examples provided herein include groups of switches which comprise two or more switches, after reading the examples and description provided herein, one of ordinary skill in the art will appreciate how many switches to include in a group of switches. In general, groups of switches may comprise M switches where M is an integer greater than two.

Current-mode control with mode transitions can be realized in the context of these multiple operation modes. One may choose to use peak current control if the first phase is the di/dt>0 phase, and valley current mode control if the first phase is the di/dt<0 phase. At the start of each cycle, one can select an intended operating mode (e.g., based on actual input/output voltages, reference or target voltages, etc.), such as one of the modes listed in Table 1. One then turns on the desired first-phase pair of switches (which switches are selected depends on the intended two-phase mode, e.g., as in Table 1) and observes inductor current. For peak current control, when the inductor current reaches a target peak current (or peak current minus a compensating ramp value), the second phase is entered until the end of the cycle. (Conversely, for valley control the inductor current reaches a target valley current or valley current plus a compensating ramp value.) An outer loop can be used to regulate the output voltage. It is notable that one may choose to utilize peak current mode control for one mode (e.g., a buck mode) and valley current mode control for another mode (e.g., a boost mode) in order to provide smaller transients in the compensator when moving from one mode to another.

It is a natural choice to select a mode at the start of each switching cycle. However, other possibilities are available. One may select a mode and keep that mode for a specified duration (e.g., a set number of cycles) or change the mode on a basis that does not correspond to a set number of cycles. One can also include hysteresis (e.g., of voltages, conversion ratios, etc.) in the mode selection decision (e.g. as one of a plurality of factors to consider), and/or place minimum or maximum durations for dwelling in a mode once it has been selected.

In some instances, described is an extended tri-phase control technique for a magnetic stage that naturally extends to tri-phase operation under conditions that require it, while providing efficient operation and simple controller realization. This enables efficient operation of a magnetic regulation stage across a wide range of voltage conversion ratios. It can be utilized with voltage mode control, current-mode control or other methods.

First it is explained how a buck operating mode with peak current-mode control can be naturally extended to a tri-phase "buck+buck-boost" mode, providing it with the ability to achieve voltage conversion ratios above one. When paired with a boost mode, this enables seamless coverage of voltage conversion ratios from less than one to greater than one without requiring pure buck-boost mode operation. An explain is then provided as to how different tri-phase operating modes can be similarly realized, such that the designer can select from among two-phase and extended tri-phase modes to realize a particular goal.

For systems that use tri-phase, buck+buck-boost operation, in some instances a design in which one has a boost mode and a buck mode can be used, where the buck mode can automatically extend to a "buck+buck-boost" tri-phase mode, via current-mode control. At the start of each switching cycle, input and output voltages (or voltage references) may be used to make an initial decision as to which mode to start in (e.g., buck or boost). If the boost mode is selected at the start of the cycle, operation can be carried out just as with conventional boost-mode control (e.g., using voltage mode control, peak current control, valley current control, etc.).

Figures 7, 7A:
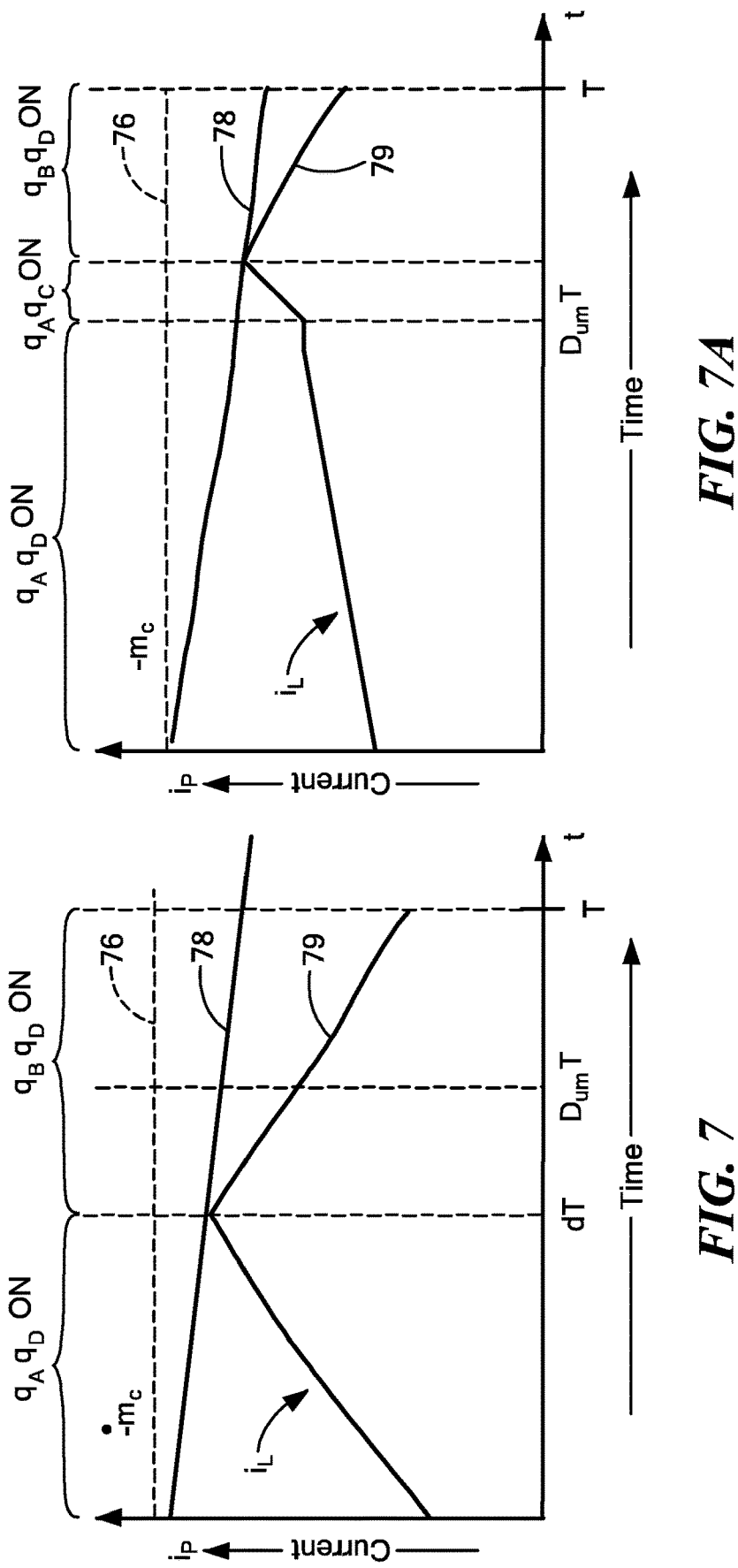
FIGS. 7 and 7A are example waveforms for buck and extended buck+buck-boost mode with current-mode control.

For selection of buck mode at the start of the cycle (with extended buck+buck-boost available) the operating cycle is as illustrated in FIGS. 7 and 7A (with switch designations as illustrated in FIGS. 3, 3A, 4, 4A and 6). Consider the case of peak current-mode control (with extended tri-phase operation).

FIGS. 7 and 7A are example waveforms for buck and extended buck+buck-boost mode with current-mode control. At the start of the cycle, switches for initiation of a buck operation cycle are turned on. If the desired condition (e.g., for peak current control) is not met within a specified time or duty ratio, "tri-phase" buck+buck-boost mode can be automatically entered and the switch configurations are changed to provide boosting capability. When the desired condition is reached, the final switch state for the cycle is entered.

At the start of the cycle (for a "buck" start"), the following procedure is followed. The appropriate switches (e.g., $q_A$, $q_D$) are turned on at the start of the cycle for phase 1, and the inductor current $i_L$ is observed and compared to a reference peak current $i_p$ (or a peak current $i_p$ minus a compensating ramp). If inductor current $i_L$ reaches reference current $i_p$ (or a peak current $i_p$ minus a compensating ramp) before a specified on-time duration (denoted $D_{um}T$ in FIGS. 7, 7A) is reached, phase 2 is entered, and the appropriate phase 2 switches (e.g., $q_B$, $q_D$) are turned on for the remainder of the cycle. If the on time duration (in terms of time or phase 1 duty cycle) of phase 1 exceeds a specified value (denoted $D_{um}T$ in FIGS. 7, 7A) before $i_L$ reaches the target value, phase 1 is ended and buck+buck-boost mode is automatically entered. The switch configuration is changed to a boost state (e.g., $q_A$, $q_C$), (denoted as phase 1B), and the inductor current $i_L$ continues to be observed and compared to a reference peak current $i_p$ (or a peak current $i_p$ minus a compensating ramp). If inductor current $i_L$ reaches the reference current $i_p$ (or a peak current $i_p$ minus a compensating ramp) before the end of the cycle, phase 2 is entered, and the appropriate phase 2 switches (e.g., $q_B$, $q_D$) are turned on for the remainder of the cycle.

The above extended tri-phase operation (buck+buck-boost) enables an extended range of voltage conversion ratios to be reached as compared to only the buck operating mode. For example, considering the topology of FIG. 4A, achievable Level 5 voltages ($v_5$) are obtainable in pure buck mode of up to:

$$v_{5,buck} \leq V_{IN} \cdot \frac{D_{UM}}{\frac{3}{5} + \frac{2}{5}D_{UM}}$$

(which is less than or equal to $V_{IN}$), but including extended buck+buck-boost operation it is possible to reach voltages of up to:

$$v_{5,buck-buck-boost} \leq V_{IN} \cdot \frac{1}{\frac{3}{5}(1 + D_{UM}) - \frac{1}{5}}$$

which is greater than $V_{IN}$. For example, by selecting $D_{UM}$ to be a value of 0.9, it is ideally possible to maintain operation in pure buck mode for voltages $v_5$ up to 0.9375 $V_{IN}$, but with extension into buck+buck-boost mode can reach voltages of up to 1.064 $V_{IN}$. By choosing an appropriate value of $D_{UM}$, a full range of voltage conversion ratios to be efficiently achieved (e.g., <, =, >1) can be enabled using only a boost mode and buck/buck+buck-boost operating mode. Similar voltage operating ranges can be readily developed for related topologies and tri-mode operations.

An advantage of this implementation of the extended "buck+buck-boost" operating mode is that the compensating ramp slope $M_c$ used for slope compensation in the basic buck operating mode under peak current control will also yield stable ripple dynamics for the extended "buck+buck-boost" operating mode.

In the extended tri-phase control principle, an approach for seamlessly extending a basic two-phase operating mode to tri-phase operation can be described. The appropriate switches are turned on at the start of the cycle for phase 1 of the basic 2-phase operating mode. If the condition for entering phase 2 of the basic operating mode is reached before a specified on-time duration within the cycle (e.g., $D_{max}T$) is reached, phase 2 is entered, and the appropriate phase 2 switches are turned on for the remainder of the cycle. The basic 2-phase operating mode is maintained in this case. If the condition for entering phase 2 of the basic operating mode is not reached before a specified on-time duration within the cycle (e.g., $D_{max}T$) is reached, the extended operating mode is entered when the specified on-time duration ($D_{max}T$) is reached. At that time the switch state is changed to the "tri-phase" state (denoted as phase 1B). If the condition for entering phase 2 of the basic operating mode is reached after the extended operating mode is entered but before the end of the cycle, the final phase of tri-state operation is initiated, and the appropriate switches are turned on for the remainder of the cycle. In many instances, the final phase will be the same as phase 2 for the basic 2-phase operating mode, but this needn't be the case in all systems.

It should be noted that for this extended tri-phase operation, in addition to considering a basic condition for switching between two phases as is done in two-phase operation (e.g., a duty cycle reached in phase 1 for voltage-mode control, or a current crossing being reached in phase 1 for current-mode control) there is a second condition being checked (e.g., a specified maximum duration $D_{max}T$ in phase 1). This second condition can be evaluated/checked with a timer, with a ramp and comparison voltage, or via other means. The comparison could be made during a first portion/phase of a cycle, a second portion/phase of a cycle or in both. It would also be possible to make some implicit comparison rather than a specific comparison of duration, such as comparisons of voltage or current ripples or profiles utilizing the waveforms of the converters and/or other synthesized signals. In all of these cases, the proposed approach yields a simply-implemented extension of a two-phase operating mode to a tri-phase operating mode and can provide an expanded achievable voltage conversion range.

Converters of the proposed approach could use one or more two-phase operating modes, and one or more modes where extended tri-phase operation is available, with the initial operating mode selected at the start of each cycle (or on some other basis) depending upon operating conditions. This yields a highly flexible way to achieve a variety of operating modes to seamlessly cover various voltage ranges or operating conditions.

Figures 8, 8A:
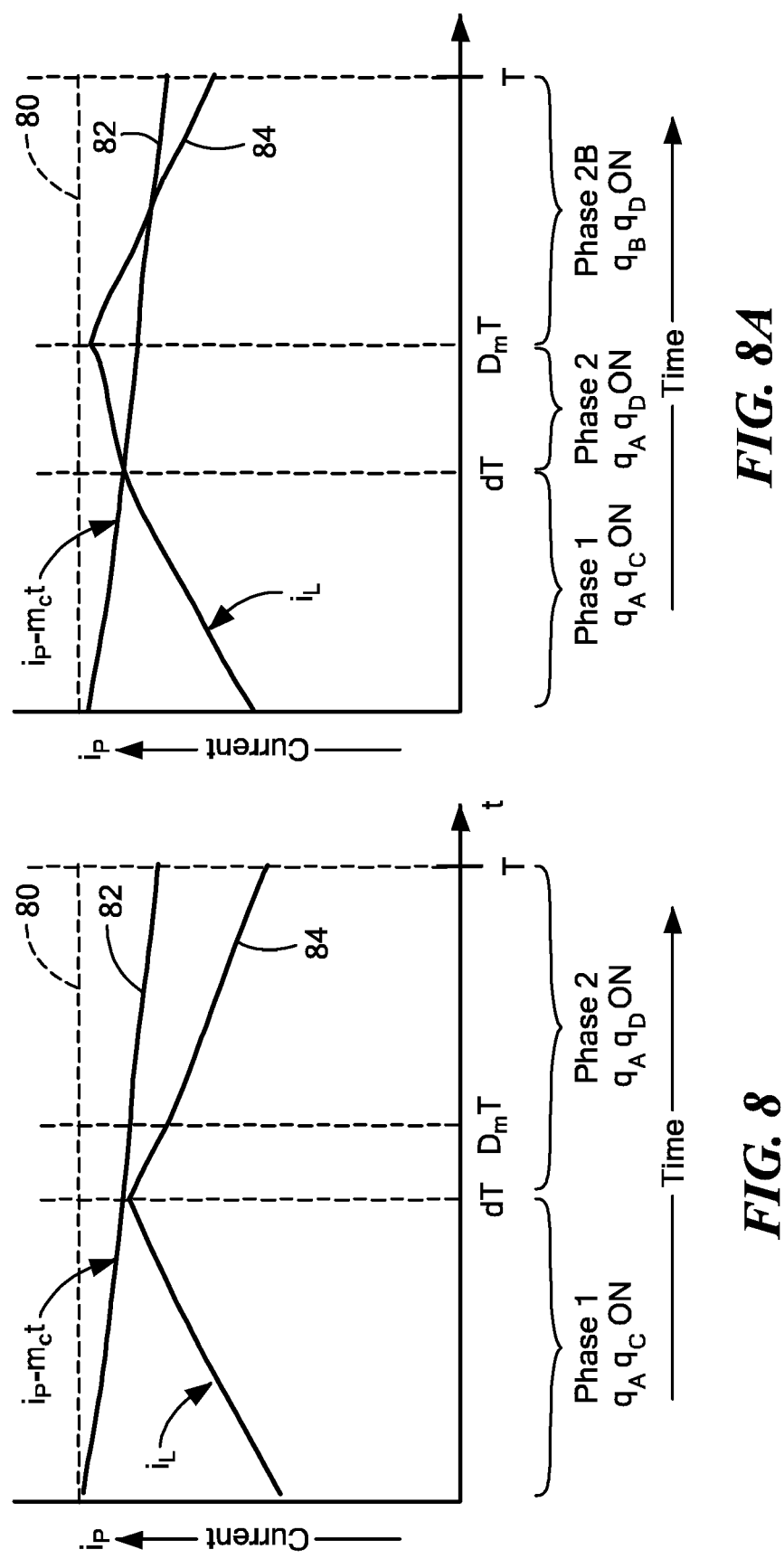
FIGS. 8 and 8A are example waveforms for a "boost-start" operation with extended tri-phase operation and peak current-mode control.

In other instances, other modes with extended tri-phase operation can be described. FIGS. 8 and 8A are example waveforms for a "boost-start" operation with extended tri-phase control under peak current-mode control. This mode is suitable, e.g., for the designs of at least FIGS. 3, 3A, 4, 4A and 6. At the start of the cycle, phase 1 is entered and switches $q_A$ and $q_C$ are turned on. This state persists until inductor current $i_L$ rises to a specified peak current $i_p$ minus a compensating ramp, at which point phase 2 is entered and switches $q_A$ and $q_D$ are turned on. Depending upon the value of the output voltage, the slope of the inductor current may be negative in phase 2 (e.g., for pure boost mode) or be positive (in which case a boost+buck-boost mode is needed.) If $i_L$ does not fall below current $i_p$ minus the compensating ramp by a time $D_MT$ is reached in the cycle, phase 2B is entered and switches $q_B$ and $q_D$ are turned on for the duration of the cycle. In this case, the availability of the extended tri-phase operation enables steady-state output voltages below $V_{IN}$, which is not possible with a pure 2-phase boost mode. One could thus cover a full range of voltages (conversion ratios $<,=,>1$) with only a buck mode and boost+ buck-boost operating mode. A benefit of this implementation is that it enables the peak current control decisions to be made only by sensing the switch A current (e.g., with a senseFET). A disadvantage of this implementation is that at the end of the cycle in extended operation both pairs of switches need to be switched, increasing overall switching loss from other possibilities.

Figures 9, 9A:
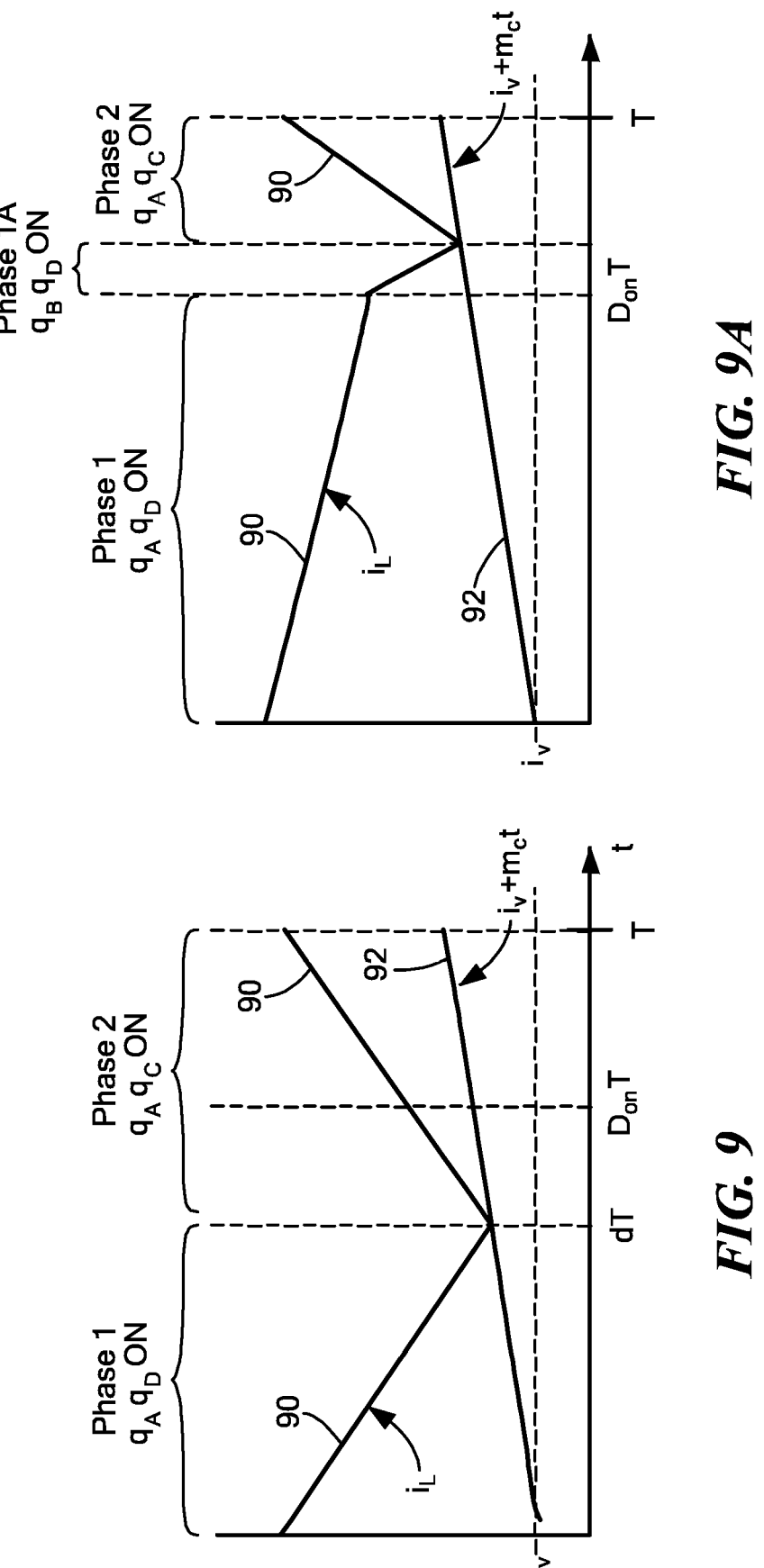
FIGS. 9 and 9A are example waveforms for a "boost-start" operation with extended tri-phase operation and valley current-mode control.

FIGS. 9 and 9A are example waveforms for a "boost-start" operation with extended tri-phase operation under valley current-mode control. This mode is also suitable, e.g., for the designs of at least FIGS. 3, 3A, 4, 4A and 6. At the start of the cycle, phase 1 is entered and switches $q_A$ and $q_D$ are turned on. If inductor current $i_L$ falls to a specified valley current $i_v$ plus a compensating ramp before a time $D_{OM}T$ is reached, phase 2 is entered at the crossing point and switches $q_A$ and $q_D$ are turned on for the remainder of the switching cycle. (This is basic 2-phase operation.) If time $D_{OM}T$ is reached before $i_L$ falls to $i_v$ plus the compensating ramp, extended tri-phase operation is initiated at that point and switches $q_B$ and $q_D$ are turned on (denoted as phase 1A). This persists until either the end of the cycle or until $i_L$ falls to $i_v$ plus the compensating ramp, at which point phase 2 is entered until the end of the cycle.

Figure 10:
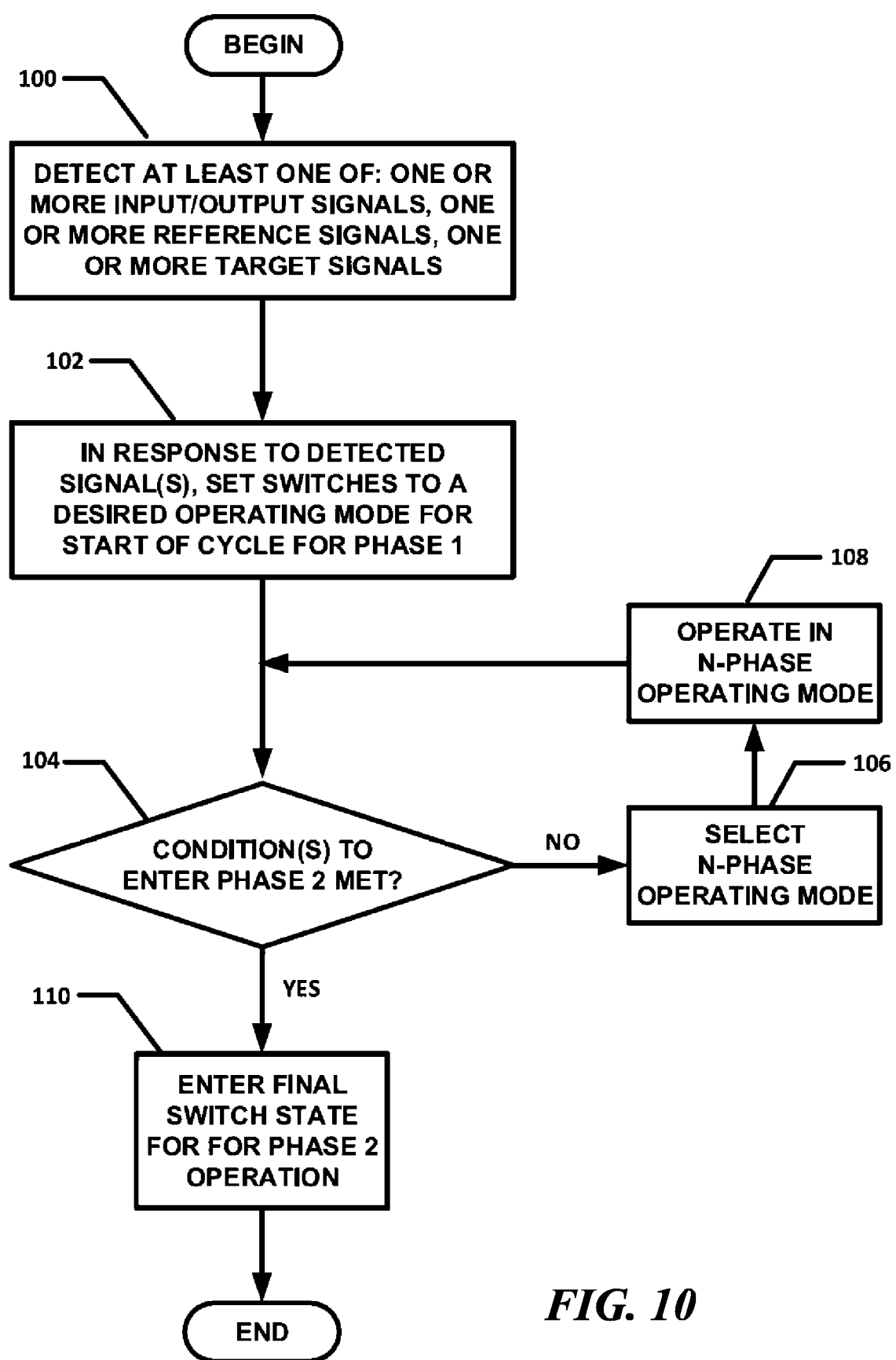
FIG. 10 is a flow diagram of an example process for controlling a magnetic regulation stage of a multiple-output supply generator.

FIG. 10 is a flow diagram showing illustrative processing that can be implemented within the system of FIG. 3, for example, and in particular within a controller such as controller 21 described in conjunction with FIG. 3. Rectangular elements (typified by element 70 in FIG. 10), are herein denoted as "processing blocks," and represent computer software instructions or groups of instructions. Diamond shaped elements (typified by element 74 in FIG. 10), are herein denoted as "decision blocks," and represent computer software instructions, or groups of instructions, which affect the execution of the computer software instructions represented by the processing blocks. Alternatively, the processing and decision blocks may represent steps performed by functionally equivalent circuits such as a digital signal processor circuit or an application specific integrated circuit (ASIC). The flow diagram does not depict the syntax of any particular programming language. Rather, the flow diagram illustrates the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated, the particular sequence of blocks described is illustrative only and can be varied without departing from the spirit of the concepts, structures, and techniques described. Thus, unless otherwise stated the blocks described below are unordered meaning that, when possible, the functions represented by the blocks can be performed in any convenient or desirable order.

Turning now to FIG. 10, processing begins by detecting a signal. As explained above at least in conjunction with FIGS. 3 and 3A, the signals may be current or voltage signals of any form (e.g. digital/analog signals, measured/estimated/derived signals, input/output/reference/target signals). Processing proceeds to processing block 102 in which in response to the detected signals (e.g. feedback signals to a controller such as controllers 21, 31 described above in conjunction with FIG. 3, 3A), switches (e.g. groups of switches) are set into their ON states to establish a desired operating mode for the magnetic regulation stage. For example, a controller may provide signals which bias a switch or group of transistors into their conducting states (i.e. their ON states) while the other switches or other groups of transistors are biased into their non-conducting states (i.e. their OFF states) for a start of the cycle for phase 1.

Processing then proceeds to decision block 104 in which a decision is made as to whether one or more conditions are met while the magnetic regulation stage is operating in its phase 1 mode. If a decision is made that one or more conditions are not met, then processing flows to processing block 106 in which an intermediate N-phase mode is selected. An intermediate N-phase mode is an operating mode of the magnetic regulation stage which is neither the phase 1 mode nor the phase 2 mode of the magnetic regulation stage during the magnetic regulation stage switching cycle. Processing then proceeds to processing block 108 in which the selected N-phase mode is entered (i.e. by switching a selected group of transistors in the magnetic regulation stage) such that the magnetic regulation stage operates in the N-phase mode (i.e. the operating mode of the magnetic regulation stage changes from the phase 1 operating mode to the N-phase operating mode.

Processing then flows back to decision block 104 in which a decision is made as to whether one or more conditions are met while the magnetic regulation stage is operating in the N-phase operating mode. If a decision is made that one or more conditions are not met, then processing again flows to processing block 106 in which an intermediate N-phase operating mode is selected. The selected N-phase operating mode may or may not be the same as the previously selected N-phase operating mode. In other words, there may be one or more intermediate phase operating modes (i.e. N-phase operating modes where N is an integer greater than 1) between the first-phase and second-phase operating modes of the magnetic regulation stage. Thus, decision block 104 and processing blocks 106, 108 implement a loop in which one or more N-phase operating modes of the magnetic regulation stage are entered until a decision is made in decision block 104 that conditions to enter phase 2 of the magnetic regulation stage switching cycle are met. Once a decision is made in decision block 104 that conditions to enter phase 2 of the magnetic regulation stage switching cycle are met, processing flows to processing block 110 where the final switch states in the magnetic regulation stage for phase 2 operation are entered.

As has been described hereinabove, the concepts describe herein can be particularly effective when a combination of peak current-mode control and valley current-mode control are used. In particular, buck and extended buck+buck-boost can utilize peak current-mode control, while boost mode can effectively utilize valley current mode control (CMC). The switching waveforms for these two modes are illustrated in FIGS. 11 and 12.

Figures 11, 12:
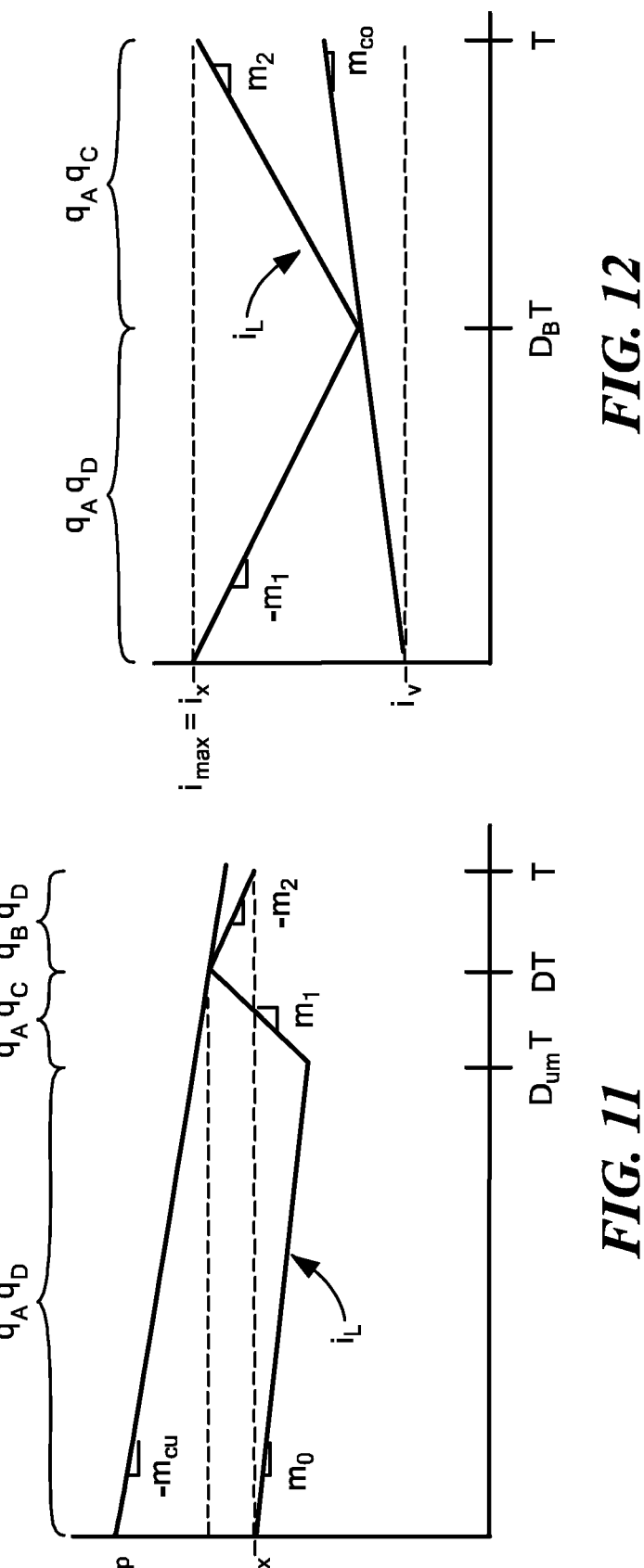
FIG. 11 is a plot of time vs. current illustrating peak current-mode control in extended Buck+Buck-Boost mode.
FIG. 12 is a plot of time vs. current illustrating valley current-mode control for boost-mode operation.

Referring now to FIGS. 11 and 12 a plot of time vs. current illustrates peak current-mode control in extended Buck+Buck-Boost mode (FIG. 11) and a plot of time vs. current illustrates valley current-mode control for boost-mode operation (FIG. 12).

It will be appreciated that one could alternatively use the (single) compensator output $i_{cmd}$ directly as $i_p$ in buck/buck+buck-boost mode, and add in a negative-valued offset $-\Delta i_{comp}$ to generate $i_v$ when in boost mode. One could alternatively add a first offset in boost mode and a second offset in buck+buck-boost mode, so long as the difference between the two offsets was the desired value $\Delta i_{comp}$.

In peak current-mode control, the compensator commands the peak current $i_p$, while in valley-mode control, the compensator commands the valley current $i_v$. In moving between extended buck+buck-boost and boost modes, then, the meaning of the compensator output value changes, as does the desired value provided by the compensator to achieve periodic steady-state operation. If the value provided by the compensator to the current controller does not change when the mode changes between extended buck+buck-boost and boost modes, there will be a transient while the converter resettles and the compensator output value adjusts. To achieve "bumpless" transfer between modes (or nearly bumpless) with a single compensator, one can introduce an offset in the value provided by the compensator to the inner loop in one of the two modes. The precise compensator change between commanding $i_p$ in extended buck+buck-boost mode and $i_v$ in boost mode can be found for the general case, but the resulting expression and its implementation is a bit complicated. However, it is possible to utilize simplified compensator offset changes and achieve fast, bumpless performance of the system.

Considering that mode transitions takes place at voltage conversion ratios very close to 1 (e.g., $V_5=V_{IN}$), we can find a simplified expression. Defining $V_M=V_5=V_{IN}$ the required offset in compensation between the peak current mode command and the valley current mode command (expressed in terms of current command) is:

$$\Delta i_{comp} = i_p - i_v = \left[ M_{co}T + \frac{1+D_{UM}}{2}M_{cu}T \right] + \frac{3(1-D_{UM})T}{10L}V_M$$

One can provide a further, even simpler, approximation to this that is not a function of the input/output voltage:

$$\Delta i_{comp} = i_p - i_v \approx [M_{co} + M_{cu}] \cdot T$$

That is, one may expect to get nearly bumpless transfer if we add in an offset equal to the sum of the compensating ramp slope amplitudes (or $2 \cdot M_c$ in the usual case where the same compensating ramp slope amplitude $M_c$ is used in each mode.) This is reasonable for the approximated condition of $V_5=V_{IN}$, since the ripple current in boost mode goes to zero and valley-mode duty ratio (of the first time segment, with inductor current decreasing) goes to 1. Consequently, we can expect to be able to use a single compensator, and simply use the compensator output directly as $i_v$ in boost mode and add in a positive-valued offset $\Delta i_{comp}$ when in buck mode/extended buck+buck-boost mode. Such an implementation is illustrated in FIG. 13.

Figure 13:
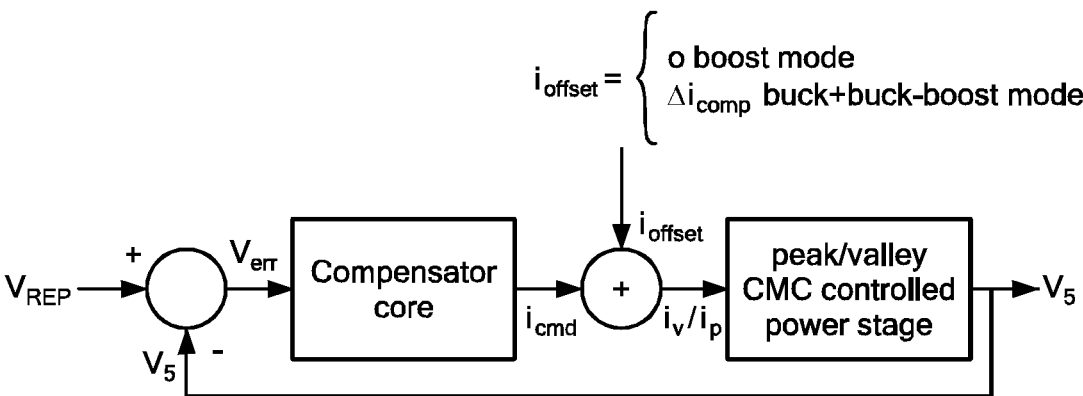
FIG. 13 is a block diagram illustrating an example implementation of a multimode controller in which an offset is added to the compensator output when changing from valley to peak current mode control.

Referring now to FIG. 13, shown is one example implementation of a multimode controller in which an offset is added to the compensator output when changing from valley to peak current mode control. The multimode controller includes a difference (or subtractor) circuit which receives a reference voltage $V_{REF}$ at first input thereof. A sample voltage $V_5$ at a second input thereof and provides an error voltage $V_{ERR}$ at an output thereof. The error voltage $V_{ERR}$ corresponds to a difference between reference voltage $V_{REF}$ and sample voltage $V_5$ (in the example circuit of FIG. 13, $V_{ERR}=V_{REF}-V_5$).

The error signal $V_{ERR}$ is provided to an input of a compensator circuit (here illustrated as a compensator core). The compensator generates a command signal (here illustrated as command current signal $i_{cmd}$) and provides the command signal to an adder (or summer) circuit which receives the command signal at first input thereof. An offset signal, (here illustrated as an offset current signal $i_{offset}$) at a second input thereof. In peak current-mode control, the compensator commands the peak current $i_p$, at an output thereof while in valley-mode control, the compensator commands the valley current $i_v$ at an output thereof. In moving between extended buck+buck-boost and boost modes, then, the meaning of the compensator output value changes, as does the desired value provided by the compensator to achieve periodic steady-state operation.

The peak/valley current signal $i_v/i_p$ is provided to an input of peak/valley current mode controlled (CMC) power stage, controlled power stage provides an output signal (here illustrated as an output voltage signal V5) at an output thereof. As noted above, the output signal value is detected and provided to an input of the difference circuit (e.g. as a feedback signal).

It will be appreciated that one could alternatively use the (single) compensator output $i_{cmd}$ directly as $i_p$ in buck/buck+buck-boost mode, and add in a negative-valued offset $-\Delta i_{comp}$ to generate $i_v$ when in boost mode. One could alternatively add a first offset in boost mode and a second offset in buck+buck-boost mode, so long as the difference between the two offsets was the desired value $\Delta i_{comp}$.

All publications and references cited herein are expressly incorporated herein by reference in their entirety.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description herein, terms such as "upper," "lower," "right," "left," "vertical," "horizontal, "top," "bottom," (to name but a few examples) and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements. Such terms are sometimes referred to as directional or positional terms.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within +20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within +20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways.

Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A controller for a power converter, the controller comprising:
   circuitry configured to control the power converter according to an operating mode selected from a plurality of operating modes, at least one operating mode having at least a first operating phase and a second operating phase, the control including:
      turning on one or more first switches of the power converter to implement the first operating phase of the operating mode; and
      in response to one or more conditions for transition from the first operating phase of the operating mode to the second operating phase of the operating mode not being met, entering an intermediate operating phase between the first operating phase and the second operating phase by turning on one or more second switches of the power converter; and
      in response to one or more conditions for transition to the second operating phase being met, entering the second operating phase by entering a final switch state for a switching cycle.

2. The controller of claim 1 wherein the one or more first switches include at least one switch also included in the one or more second switches.

3. The controller of claim 1 wherein the one or more first switches include at least one switch not included in the one or more second switches.

4. The controller of claim 1 wherein the circuitry is coupled to control individual switches of the plurality.

5. The controller of claim 1 wherein the one or more first switches and the one or more second switches are part of a magnetic regulation stage of the power converter.

6. The controller of claim 1 wherein the circuitry is configured to select the operating mode from the plurality of operating modes based on some desired range of voltage conversion ratios.

7. The controller of claim 1 wherein the circuitry is further configured to select the operating mode from the plurality of operating modes based upon one or more signals.

8. The controller of claim 7 wherein the one or more signals comprise derived signals.

9. The controller of claim 7 wherein the one or more signals comprise an input signal to a magnetic regulation stage or an output signal to the magnetic regulation stage.

10. The controller of claim 7 wherein:
    the one or more signals can be voltage signals or current signals, and
    the one or more signals can be one of: one or more measured signals, one or more estimated signals, and one or more derived signals.

11. The controller of claim 10 wherein the one or more derived signals comprise a current signal combined with a compensation signal.

12. The controller of claim 11 wherein the compensation signal has a ramp shape.

13. The controller of claim 1 wherein the circuitry is configured to select the operating mode at a start of each switching cycle.

14. The controller of claim 1 wherein the circuitry is configured to select the operating mode every N switching cycles, where N is an integer greater than one.

15. The controller of claim 14 wherein selecting the operating mode every N switching cycles comprises using at least one of: one or more input signals, one or more output signals, one or more reference signals, and one or more target signals to make an initial decision as to which operating mode to start in.

16. The controller of claim 1 wherein the circuitry is configured to select the operating mode on basis that does not correspond to a set number of cycles.

17. The controller of claim 1 wherein the circuitry is configured to perform one of:
    selecting the operating mode and keeping that operating mode for a specified duration; and
    selecting the operating mode and keeping that operating mode for a set number of switch cycles.

18. The controller of claim 1 wherein the circuitry is configured to select the operating mode while considering one or more of: hysteresis of signal voltages, and hysteresis of conversion ratios.

19. The controller of claim 1 wherein the circuitry is configured to:
    select the operating mode; and
    place minimum and/or maximum durations for dwelling in the operating mode once it has been selected.

20. The controller of claim 1 wherein the plurality of operating modes includes at least two of: a buck-derived mode, a boost-derived mode, a buck-boost derived mode, and a bypass mode.

21. The controller of claim 1 wherein the circuitry is configured to control the power converter using current-mode control with mode transitions.

22. The controller of claim 21 wherein the circuitry is configured to control the power converter using peak current control for at least one of the plurality of modes, and using valley current control for at least another one of the plurality of modes.

23. The controller of claim 22 wherein, when using the peak current control, the second operating phase is entered until an end of the cycle in response to an inductor current of the power converter reaching a current based on a target peak current.

24. The controller of claim 22 wherein, when using the valley current control, the second operating phase is entered until an end of the cycle in response to an inductor current of the power converter reaching a current based on a target valley current.

25. The controller of claim 21 wherein the circuitry is configured to control the power converter using peak current control if the first operating phase is a di/dt>0 phase.

26. The controller of claim 21 wherein the circuitry is configured to control the power converter using valley current control if the first operating phase is a di/dt<0 phase.

27. A method for controlling a power converter configured to operate in a plurality of operating modes, the method comprising:

turning on one or more first switches of the power converter to implement a first operating phase of an operating mode selected from the plurality of operating modes; and in response to one or more conditions for transition from the first operating phase of the operating mode to a second operating phase of the operating mode not being met, entering an intermediate operating phase between the first operating phase and the second operating phase by turning on one or more second switches of the power converter; and in response to one or more conditions for transition to the second operating phase being met, entering the second operating phase by entering a final switch state for a switching cycle.

28. The method of claim 27 wherein the one or more first switches include at least one switch also included in the one or more second switches.

29. The method of claim 27 wherein the one or more first switches include at least one switch not included in the one or more second switches.

30. The method of claim 27 wherein the one or more first switches and the one or more second switches are part of a magnetic regulation stage of the power converter.

31. The method of claim 27 further comprising selecting the operating mode from the plurality of operating modes based on some desired range of voltage conversion ratios.

32. The method of claim 27 further comprising selecting the operating mode from the plurality of operating modes based upon one or more signals.

33. The method of claim 32 wherein the one or more signals comprise derived signals.

34. The method of claim 32 wherein the one or more signals comprise an input signal to a magnetic regulation stage or an output signal to the magnetic regulation stage.

35. The method of claim 32 wherein:

the one or more signals can be voltage signals or current signals, and the one or more signals can be one of: one or more measured signals, one or more estimated signals, and one or more derived signals.

36. The method of claim 35 wherein the one or more derived signals comprise a current signal combined with a compensation signal.

37. The method of claim 36 wherein the compensation signal has a ramp shape.

38. The method of claim 27 further comprising selecting the operating mode at a start of each switching cycle.

39. The method of claim 27 further comprising selecting the operating mode every N switching cycles, where N is an integer greater than one.

40. The method of claim 39 wherein selecting the operating mode every N switching cycles comprises using at least one of: one or more input signals, one or more output signals, one or more reference signals, and one or more target signals to make an initial decision as to which operating mode to start in.

41. The method of claim 27 further comprising selecting the operating mode on basis that does not correspond to a set number of cycles.

42. The method of claim 27 further comprising one of:

selecting the operating mode and keeping that operating mode for a specified duration; and selecting the operating mode and keeping that operating mode for a set number of switch cycles.

43. The method of claim 27 further comprising selecting the operating mode while considering one or more of: hysteresis of signal voltages, and hysteresis of conversion ratios.

44. The method of claim 27 further comprising:

selecting the operating mode; and placing minimum and/or maximum durations for dwelling in the operating mode once it has been selected.

45. The method of claim 27 wherein the plurality of operating modes includes at least two of: a buck-derived mode, a boost-derived mode, a buck-boost derived mode, and a bypass mode.

46. The method of claim 27 further comprising controlling the power converter using current-mode control with mode transitions.

47. The method of claim 46 further comprising controlling the power converter using peak current control for at least one of the plurality of modes, and using valley current control for at least another one of the plurality of modes.

48. The method of claim 47 wherein, when using the peak current control, the second operating phase is entered until an end of the cycle in response to an inductor current of the power converter reaching a current based on a target peak current.

49. The method of claim 47 wherein, when using the valley current control, the second operating phase is entered until an end of the cycle in response to an inductor current of the power converter reaching a current based on a target valley current.

50. The method of claim 46 further comprising controlling the power converter using peak current control if the first operating phase is a di/dt>0 phase.

51. The method of claim 46 further comprising controlling the power converter using valley current control if the first operating phase is a di/dt<0 phase.

* * * * *